(12) United States Patent
Matsuura

(10) Patent No.: US 12,433,049 B2
(45) Date of Patent: Sep. 30, 2025

(54) IMAGING DEVICE AND ELECTRONIC APPARATUS

(71) Applicant: SONY SEMICONDUCTOR SOLUTIONS CORPORATION, Kanagawa (JP)

(72) Inventor: Kouji Matsuura, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 355 days.

(21) Appl. No.: 18/004,478

(22) PCT Filed: Jul. 6, 2021

(86) PCT No.: PCT/JP2021/025475
§ 371 (c)(1),
(2) Date: Jan. 6, 2023

(87) PCT Pub. No.: WO2022/014412
PCT Pub. Date: Jan. 20, 2022

(65) Prior Publication Data
US 2023/0326940 A1    Oct. 12, 2023

(30) Foreign Application Priority Data
Jul. 14, 2020   (JP) .................................. 2020-120361

(51) Int. Cl.
*H10F 39/00*    (2025.01)
*H04N 25/709*   (2023.01)
*H04N 25/78*    (2023.01)

(52) U.S. Cl.
CPC ..... *H10F 39/80373* (2025.01); *H04N 25/709* (2023.01); *H04N 25/78* (2023.01)

(58) Field of Classification Search
CPC . H10F 39/80373; H04N 25/709; H04N 25/78
USPC ........................................................... 257/292
See application file for complete search history.

(56) References Cited

U.S. PATENT DOCUMENTS 8,872,938 B2 * 10/2014 Yoo .................. H04N 25/78
                                                    348/320
2018/0103222 A1   4/2018 Yan

FOREIGN PATENT DOCUMENTS

JP         11-205693 A     7/1999
JP         2014-120860 A   6/2014

OTHER PUBLICATIONS

International Search Report and Written Opinion of PCT Application No. PCT/JP2021/025475, issued on Sep. 14, 2021, 08 pages of ISRWO.

* cited by examiner

*Primary Examiner* — Tu-Tu V Ho
(74) *Attorney, Agent, or Firm* — CHIP LAW GROUP

(57) ABSTRACT

The present disclosure provides an imaging device capable of suppressing, when an analog pixel signal is compared with a predetermined reference signal, an error in inversion timing of the comparison result. The imaging device according to the present disclosure includes: a load current source; a comparator that is provided between a signal line for transmitting an analog pixel signal read from a pixel and the load current source and compares the analog pixel signal with a predetermined reference signal; and a negative capacitance circuit connected to the signal line. The load current source has two cascode-connected transistors. The negative capacitance circuit applies a voltage of the signal line to a common connection node of the two transistors of the load current source via a capacitive element without logic inversion.

11 Claims, 18 Drawing Sheets

TO ANALOG—DIGITAL CONVERSION UNIT

IMAGING DEVICE AND ELECTRONIC APPARATUS

CROSS REFERENCE TO RELATED APPLICATIONS

This application is a U.S. National Phase of International Patent Application No. PCT/JP2021/025475 filed on Jul. 6, 2021, which claims priority benefit of Japanese Patent Application No. JP 2020-120361 filed in the Japan Patent Office on Jul. 14, 2020. Each of the above-referenced applications is hereby incorporated herein by reference in its entirety.

TECHNICAL FIELD

The present disclosure relates to an imaging device and an electronic apparatus.

BACKGROUND ART

An analog-digital conversion unit that digitizes an analog pixel signal read from a pixel is mounted on an imaging device. The analog-digital conversion unit is a so-called column-parallel analog-digital conversion unit including a plurality of analog-digital converters arranged corresponding to pixel columns.

As the analog-digital converter constituting the column-parallel analog-digital conversion unit, a so-called single-slope analog-digital converter is known, for example. The single-slope analog-digital converter digitizes an analog pixel signal read from a pixel by comparing the analog pixel signal with a predetermined reference signal.

The single-slope analog-digital converter includes, for example, a comparator that compares an analog pixel signal with a predetermined reference signal, and a counter that performs counting on the basis of a comparison result of the comparator. As an imaging device having a single-slope analog-digital converter, an imaging device including, for example, a P-channel metal-oxide-semiconductor (MOS) transistor and an inverter which are disposed in a comparator has been proposed (see, for example, Patent Document 1). In this imaging device, the P-channel MOS transistor has a source electrode to which an analog pixel signal is input, and a gate electrode to which a predetermined reference signal is input.

CITATION LIST

Patent Document

Patent Document 1: US 2018/0103222 A1

SUMMARY OF THE INVENTION

Problems to be Solved by the Invention

In the imaging device described in Patent Document 1, the comparator in the analog-digital converter is configured to share a load current source of the pixel (pixel circuit) as a current source. Due to the sharing of the current source, the imaging device described in Patent Document 1 reduces power consumption, as compared with a configuration in which a current source is also provided in the comparator separately from the pixel circuit.

However, in the above-described connection configuration to the P-channel MOS transistor in the imaging device described in Patent Document 1, a drain voltage of the P-channel MOS transistor varies according to the level of the pixel signal when the analog pixel signal coincides with the predetermined reference signal. Therefore, the timing at which the comparison result of the comparator is inverted may deviate from the ideal timing at which the pixel signal and the reference signal coincide with each other. There is a problem that, due to an error in the inversion timing, an error or nonlinearity occurs in a digital signal obtained by converting the analog pixel signal, and thus the image quality of image data deteriorates.

An object of the present disclosure is to provide an imaging device capable of suppressing an error in inversion timing of a comparison result when an analog pixel signal is compared with a predetermined reference signal, and an electronic apparatus including the imaging device.

Solutions to Problems

In order to achieve the above object, an imaging device according to the present disclosure includes:

a load current source;

a comparator that is provided between a signal line for transmitting an analog pixel signal read from a pixel and the load current source and compares the analog pixel signal with a predetermined reference signal; and a negative capacitance circuit connected to the signal line; in which the load current source includes two cascode-connected transistors, and the negative capacitance circuit applies a voltage of the signal line to a common connection node of the two transistors of the load current source via a capacitive element without logic inversion.

Further, an electronic apparatus according to the present disclosure for achieving the above object includes the imaging device configured as described above.

MODE FOR CARRYING OUT THE INVENTION

Figure 1:
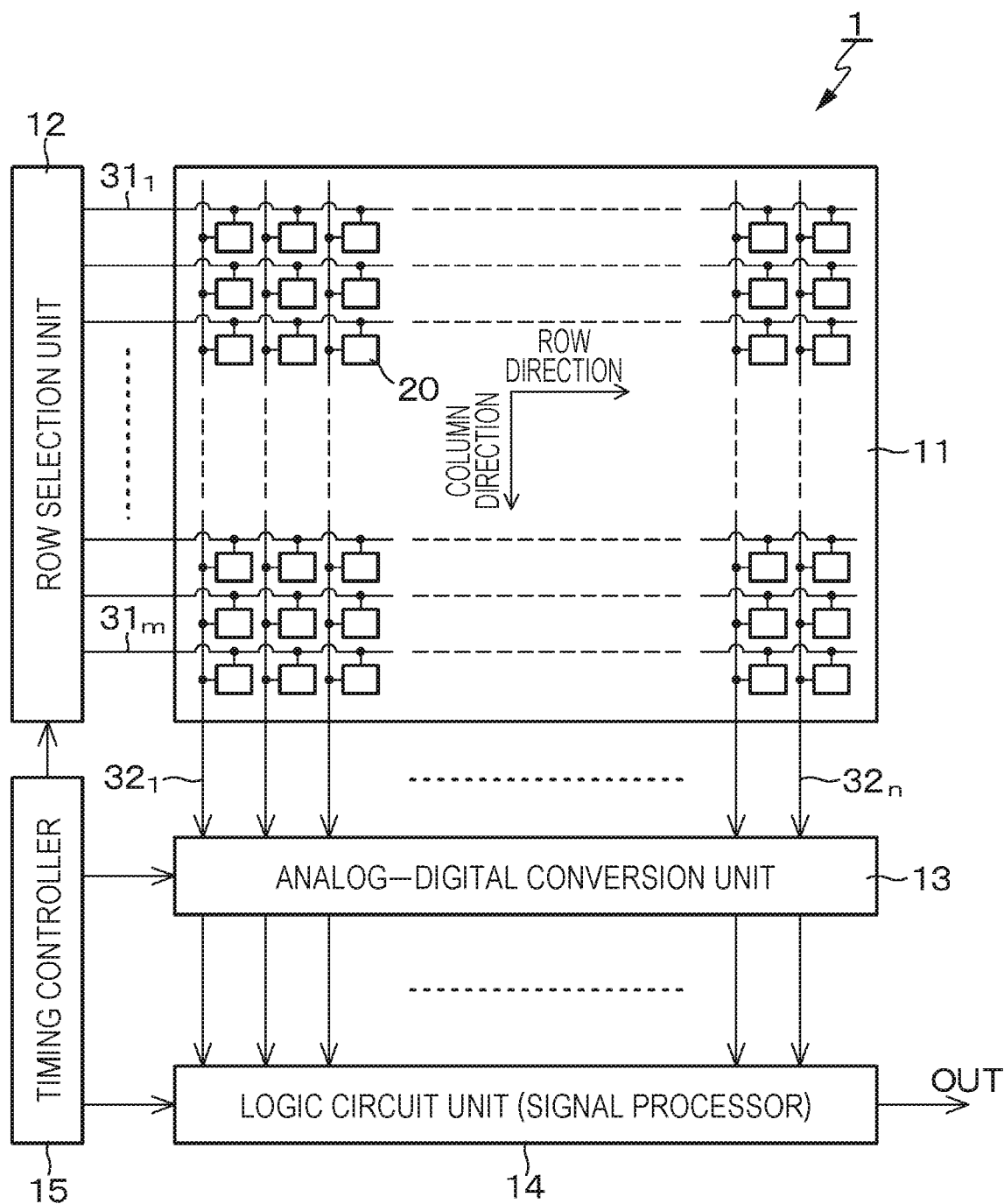
FIG. 1 is a block diagram schematically illustrating an outline of a system configuration of a CMOS image sensor which is an example of an imaging device to which the technology according to the present disclosure is applied.

Modes (hereinafter referred to as embodiments) for carrying out the technology according to the present disclosure will be described below in detail with reference to the drawings. The technology according to the present disclosure is not limited to the embodiments. In the following description, the same reference numerals are used for the same elements or elements having the same function, and redundant description will be omitted. Note that the description will be given in the following order.

1. General description of imaging device and electronic apparatus according to present disclosure
2. Imaging device to which technology according to present disclosure is applied
  2-1. Configuration example of CMOS image sensor
  2-2. Example of circuit configuration of pixel
  2-3. Configuration example of analog-digital conversion unit
  2-4. Semiconductor chip structure
  2-4-1. Flat-type semiconductor chip structure
  2-4-2. Stacked-type semiconductor chip structure
3. Embodiment of present disclosure
  3-1. Example 1 (example in which negative capacitance circuit is connected to load current source of input stage of comparator)
    3-1-1. Example of circuit configuration of comparator
    3-1-2. Example of circuit operation of comparator
    3-1-3. Negative capacitance circuit
  3-2. Example 2 (modification of Example 1: circuit example of negative capacitance circuit)
  3-3. Example 3 (example in which negative capacitance circuit is connected to load current source of output stage of comparator)
  3-4. Example 4 (example in which negative capacitance circuit is connected to load current sources of input stage and output stage of comparator)
  3-5. Example 5 (example of including load current source for signal line)
  3-6. Example 6 (example of including clamp transistor that clamps voltage of signal line)
4. Modifications
5. Application example
6. Examples of application of technology according to present disclosure
  6-1. Electronic apparatus according to present disclosure (example of imaging system)
  6-2. Application to mobile object
7. Possible configurations of present disclosure General Description of Imaging Device and Electronic Apparatus According to Present Disclosure In the imaging device and the electronic apparatus according to the present disclosure, the load current source can include an input-side load current source and an output-side load current source. Furthermore, the comparator can include an input transistor connected between the signal line and the input-side load current source and having a predetermined reference signal as a gate input, and an output transistor connected between the signal line and the output-side load current source and having an output of the input transistor as a gate input.

In the imaging device and the electronic apparatus according to the present disclosure including the abovementioned preferable configuration, the negative capacitance circuit can be configured to apply the voltage of the signal line to: a common connection node of two cascode-connected transistors of the input-side load current source via the capacitive element without logic inversion; a common connection node of two cascode-connected transistors of the output-side load current source via the capacitive element without logic inversion; or both the connection node of the two cascode-connected transistors of the input-side load current source and the connection node of the two cascode-connected transistors of the output-side load current source via the capacitive element without logic inversion.

In addition, the imaging device and the electronic apparatus according to the present disclosure including the preferable configuration described above can be configured such that a load current source for signal line having two cascode-connected transistors is connected to the signal line. Further, the negative capacitance circuit can apply the voltage of the signal line to a common connection node of the two cascode-connected transistors of the load current source for signal line via the capacitive element without logic inversion.

In addition, in the imaging device and the electronic apparatus according to the present disclosure including the preferable configuration described above, a first adjustment unit and a second adjustment unit can be mounted on the signal line. The first adjustment unit adjusts bias voltages of the two cascode-connected transistors of the input-side load current source and bias voltages of the two cascode-connected transistors of the output-side load current source. The second adjustment unit adjusts bias voltages of the two cascode-connected transistors of the load current source for signal line.

In addition, the imaging device and the electronic apparatus according to the present disclosure including the preferable configuration described above can be configured such that the negative capacitance circuit includes a non-inverting amplifier having an input end connected to the signal line. In this configuration, another end of the non-inverting amplifier is connected to another end of the capacitive element that has one end connected to the common connection node of the two cascode-connected transistors of the load current source. In addition, the non-inverting amplifier includes: a transistor that is connected between a high-potential-side power supply and the other end of the capacitive element and that has a gate electrode connected to the signal line; and a current source connected between the other end of the capacitive element and a low-potential-side power supply.

In addition, the imaging device and the electronic apparatus according to the present disclosure including the preferable configuration described above can be configured such that the negative capacitance circuit includes, for the signal line, a clamp transistor connected in parallel with the transistor constituting the non-inverting amplifier.

Imaging Device to which Technology According to Present Disclosure is Applied

As an imaging device to which the technology according to the present disclosure is applied, a complementary metal oxide semiconductor (CMOS) image sensor which is a kind of X-Y address imaging device will be described as an example. The CMOS image sensor is an image sensor manufactured by applying or partially using a CMOS process.

[Configuration Example of CMOS Image Sensor]

FIG. 1 is a block diagram schematically illustrating an outline of a system configuration of a CMOS image sensor which is an example of the imaging device to which the technology according to the present disclosure is applied.

The CMOS image sensor 1 according to the present application example includes a pixel array section 11 and a peripheral circuit section of the pixel array section 11. The pixel array section 11 has pixels (pixel circuits) 20 which are two-dimensionally arranged in a row direction and a column direction, that is, in a matrix. Each of the pixels includes a light receiving element. Here, the row direction refers to a direction in which the pixels 20 in a pixel row are arrayed, and the column direction refers to a direction in which the pixels 20 in a pixel column are arrayed. The pixel 20 performs photoelectric conversion to generate and accumulate a photoelectric charge corresponding to an amount of received light.

The peripheral circuit section of the pixel array section 11 includes, for example, a row selection unit 12, an analog-digital conversion unit 13, a logic circuit unit 14 as a signal processor, a timing controller 15, and the like.

In the pixel array section 11, a pixel control line 31 ($31_1$ to $31_m$) is wired for each pixel row along the row direction with respect to the pixels arrayed in a matrix. In addition, a signal line 32 ($32_1$ to $32_n$) is wired for each pixel column along the column direction. The pixel control line 31 transmits a drive signal for performing driving to read a signal from the pixel 20. Although FIG. 1 indicates the pixel control line 31 as one wiring line, the pixel control line 31 is not limited to be constituted by one wiring line. One ends of the pixel control lines 31 are connected to output ends of the row selection unit 12 corresponding to the respective rows.

The components of the peripheral circuit section of the pixel array section 11, that is, the row selection unit 12, the analog-digital conversion unit 13, the logic circuit unit 14, and the timing controller 15, will be described below.

The row selection unit 12 includes a shift register, an address decoder, and the like, and controls scanning of a pixel row and an address of the pixel row when selecting each pixel 20 of the pixel array section 11. Although the specific configuration of the row selection unit 12 is not shown, the row selection unit 12 commonly has two scanning systems which are a read scanning system and a sweep scanning system.

The read scanning system selectively scans the pixels 20 in the pixel array section 11 sequentially on a row-by-row basis in order to read pixel signals from the pixels 20. The pixel signal read from each pixel 20 is an analog signal. The sweep scanning system performs sweep scanning before the read scanning by a time corresponding to a shutter speed on the row being read on which the read scanning is performed by the read scanning system.

By the sweep scanning by the sweep scanning system, unnecessary charges are swept out from photoelectric conversion elements of the pixels 20 in the row being read, whereby the photoelectric conversion elements are reset. Then, due to unnecessary charges being swept out (reset) by the sweeping scanning system, a so-called electronic shutter operation is performed. In this case, the electronic shutter operation means an operation in which photoelectric charges in the photoelectric conversion element are removed and exposure is started anew (accumulation of the photoelectric charges is started).

The analog-digital conversion unit 13 includes a set of a plurality of analog-digital converters (ADC) provided corresponding to the pixel columns of the pixel array section 11 (for example, provided for each pixel column). The analog-digital conversion unit 13 is a column-parallel analog-digital conversion unit that converts an analog pixel signal output through each of the signal lines $32_1$ to $32_n$ for each pixel column into a digital signal.

As the analog-digital converter in the analog-digital conversion unit 13, for example, a single-slope analog-digital converter which is an example of a reference signal comparison type analog-digital converter can be used.

The logic circuit unit 14 which is a signal processor reads the pixel signal digitized by the analog-digital conversion unit 13 and performs predetermined signal processing. Specifically, the logic circuit unit 14 performs, as the predetermined signal processing, correction of a vertical line defect or a point defect, clamping of a signal, or digital signal processing such as parallel-to-serial conversion, compression, encoding, addition, averaging, and intermittent operation, for example. The logic circuit unit 14 outputs the generated image data to a subsequent device as an output signal OUT of the CMOS image sensor 1.

The timing controller 15 generates various signals such as a timing signal, a clock signal, and a control signal on the basis of a synchronization signal provided from the outside. Then, the timing controller 15 performs drive control of the row selection unit 12, the analog-digital conversion unit 13, the logic circuit unit 14, and the like on the basis of the generated signals.

[Example of Circuit Configuration of Pixel]

Figure 2:
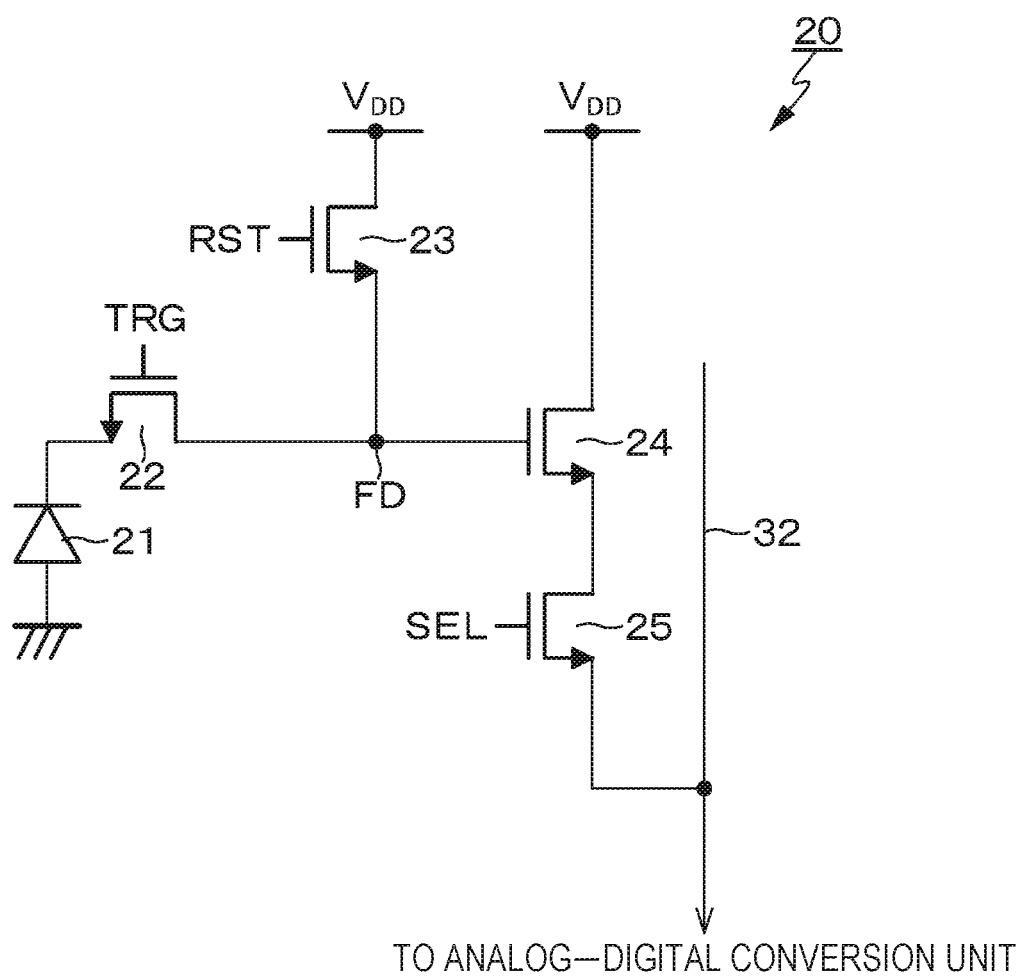
FIG. 2 is a circuit diagram illustrating an example of a circuit configuration of a pixel.

FIG. 2 is a circuit diagram illustrating an example of a circuit configuration of each of the pixels 20. The pixel 20 includes, for example, a photodiode 21 as the photoelectric conversion element. The pixel 20 includes a transfer transistor 22, a reset transistor 23, an amplification transistor 24, and a selection transistor 25 in addition to the photodiode 21.

As the four transistors which are the transfer transistor 22, the reset transistor 23, the amplification transistor 24, and the selection transistor 25, N-channel MOS field effect transistors are used, for example. It is to be noted that the combination of the conductivity types of the four transistors 22 to 25 described here is merely an example, and the combination is not limited thereto.

For the pixels 20, a plurality of pixel control lines is wired in common to the pixels 20 in the same pixel row as the above-described pixel control lines 31 ($31_1$ to $31_m$). Each of the plurality of pixel control lines is connected to the corresponding one of the output ends corresponding to each pixel row of the row selection unit 12 on a pixel-row basis. The row selection unit 12 appropriately outputs a transfer signal TRG, a reset signal RST, and a selection signal SEL to the plurality of pixel control lines.

The photodiode 21 has an anode electrode connected to a low-potential-side power supply (for example, ground). The photodiode 21 photoelectrically converts received light into photoelectric charges (here, photoelectrons) in an amount corresponding to the amount of received light, and accumulates the photoelectric charges. A cathode electrode of the photodiode 21 is electrically connected to a gate electrode of the amplification transistor 24 via the transfer transistor 22. Here, a region where the gate electrode of the amplification transistor 24 is electrically connected is a floating diffusion (floating diffusion region/impurity diffusion region) FD. The floating diffusion FD is a charge-voltage conversion unit that converts a charge into a voltage.

A transfer signal TRG that is active at high level (for example, $V_{DD}$ level) is supplied from the row selection unit 12 to a gate electrode of the transfer transistor 22. The transfer transistor 22 is conductive in response to the transfer signal TRG, thereby transferring the photoelectric charges photoelectrically converted by the photodiode 21 and accumulated in the photodiode 21 to the floating diffusion FD.

The reset transistor 23 is connected between a node of the high-potential-side power supply voltage $V_{DD}$ and the floating diffusion FD. A reset signal RST that is active at high level is provided from the row selection unit 12 to a gate electrode of the reset transistor 23. The reset transistor 23 is conductive in response to the reset signal RST, and resets the floating diffusion FD by discharging the charges of the floating diffusion FD to the node of the voltage $V_{DD}$.

The amplification transistor 24 has a gate electrode connected to the floating diffusion FD and a drain electrode connected to a node of the high-potential-side power supply voltage $V_{DD}$. The amplification transistor 24 serves as an input unit of a source follower that reads a signal obtained by photoelectric conversion in the photodiode 21. That is, a source electrode of the amplification transistor 24 is connected to the signal line 32 via the selection transistor 25.

The selection transistor 25 has a drain electrode connected to the source electrode of the amplification transistor 24, and a source electrode connected to the signal line 32. A selection signal SEL which is active at high level is provided from the row selection unit 12 to a gate electrode of the selection transistor 25. The selection transistor 25 is conductive in response to the selection signal SEL, thereby transmitting the signal output from the amplification transistor 24 to the signal line 32 with the pixel 20 in a selected state.

Note that, in the above circuit example, the pixel 20 has a 4-transistor (Tr) configuration including four transistors which are the transfer transistor 22, the reset transistor 23, the amplification transistor 24, and the selection transistor 25, but the configuration is not limited thereto. For example, the pixel 20 may have a 3-Tr configuration in which the selection transistor 25 is eliminated, and the amplification transistor 24 has the function of the selection transistor 25, or may have a 5- or more-Tr configuration in which the number of transistors is increased, as necessary.

[Configuration Example of Analog-Digital Conversion Unit]

Next, an example of a configuration of the analog-digital conversion unit 13 will be described. Here, a single-slope analog-digital converter is used as each analog-digital converter of the analog-digital conversion unit 13.

Figure 3:
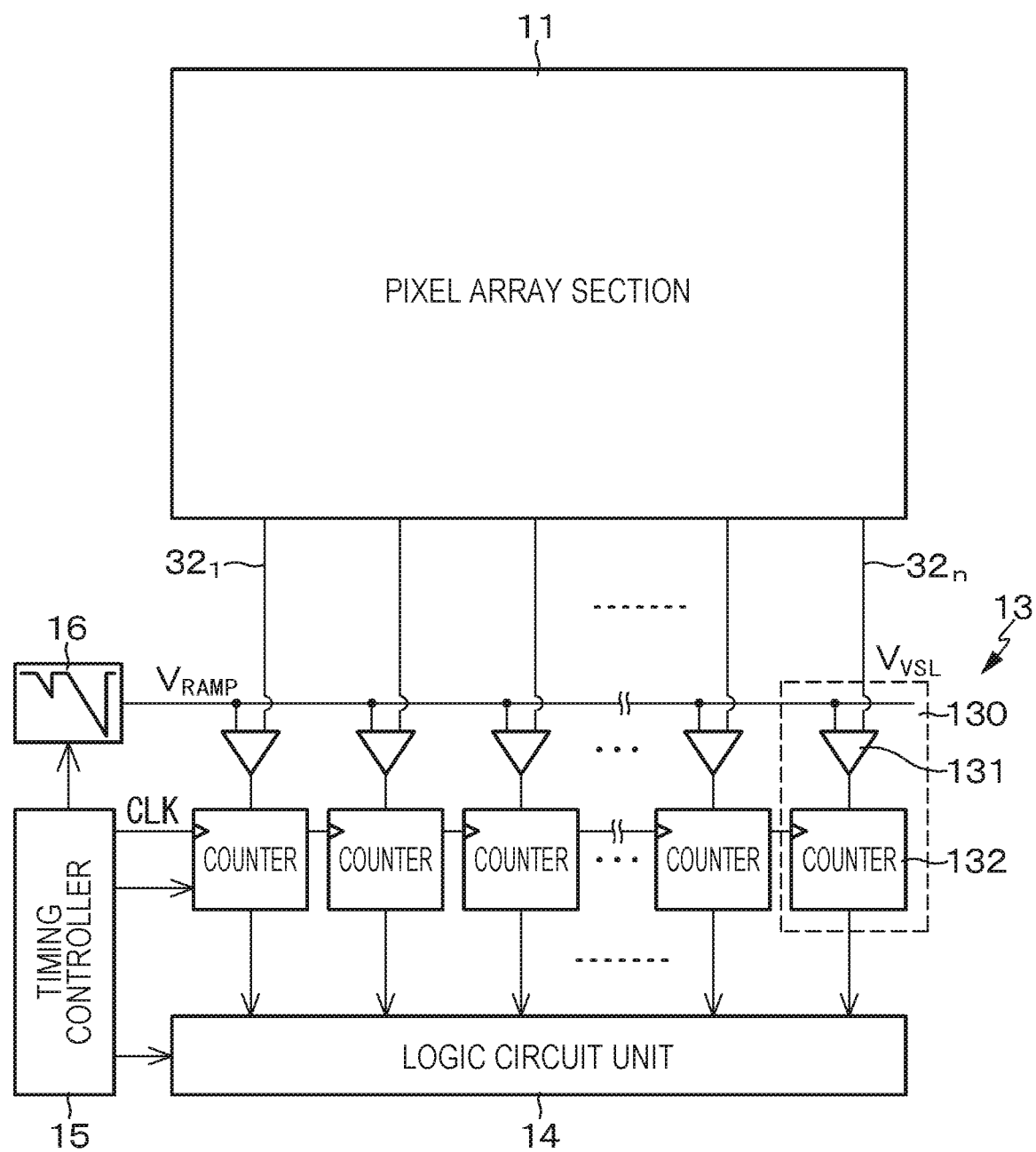
FIG. 3 is a block diagram schematically illustrating an example of a configuration of an analog-digital conversion unit.

FIG. 3 illustrates an example of the configuration of the analog-digital conversion unit 13. In the CMOS image sensor 1, the analog-digital conversion unit 13 includes a set of a plurality of single-slope analog-digital converters provided corresponding to each pixel column of the pixel array section 11. Here, a single-slope analog-digital converter 130 of the nth column will be described as an example.

The analog-digital converter 130 has a circuit configuration including a comparator 131 and a counter 132. Then, the single-slope analog-digital converter 130 uses a reference signal generated by a reference signal generation unit 16. The reference signal generation unit 16 includes, for example, a digital-analog converter (DAC), generates a ramp wave reference signal $V_{RAMP}$ whose level (voltage) monotonously decreases with the lapse of time, and gives the ramp wave reference signal $V_{RAMP}$ to the comparator 131 provided for each pixel column as a standard signal.

The comparator 131 uses the analog pixel signal $V_{VSL}$ read from the pixel 20 as a comparison input and the ramp wave reference signal $V_{RAMP}$ generated by the reference signal generation unit 16 as a reference input, and compares both signals. Then, when the reference signal $V_{RAMP}$ is larger than the pixel signal $V_{VSL}$, the output of the comparator 131 has a first state (for example, high level), and when the reference signal $V_{RAMP}$ is equal to or smaller than the pixel signal $V_{VSL}$, the output has a second state (for example, low level). As a result, the comparator 131 outputs, as a comparison result, a pulse signal having a pulse width corresponding to the signal level of the pixel signal $V_{VSL}$, specifically, the magnitude of the signal level.

The clock signal CLK is supplied from the timing controller 15 to the counter 132 at the same timing as the supply start timing of the reference signal $V_{RAMP}$ to the comparator 131. Then, the counter 132 performs a counting operation in synchronization with the clock signal CLK to measure the period of the pulse width of the output pulse of the comparator 131, that is, the period from the start of the comparison operation to the end of the comparison operation. The count result (count value) of the counter 132 is supplied to the logic circuit unit 14 as a digital value obtained by digitizing the analog pixel signal $V_{VSL}$.

According to the analog-digital conversion unit 13 including the set of single-slope analog-digital converters 130 described above, it is possible to obtain a digital value from information regarding the time until the magnitude relationship between the ramp wave reference signal $V_{RAMP}$ generated by the reference signal generation unit 16 and the analog pixel signal $V_{VSL}$ read from the pixel 20 through the signal line 32 changes.

Note that, although the analog-digital converters 130 are disposed in a one-to-one correspondence with the pixel columns of the pixel array section 11 as the analog-digital conversion unit 13 in the above example, each of the analog-digital converters 130 can be disposed for a plurality of pixel columns.

In the above-described single-slope analog-digital converter 130, a comparator having a differential amplifier configuration is generally used as the comparator 131.

However, the comparator having a differential amplifier configuration entails a problem that the power consumption of the analog-digital converter 130 and the power consumption of the CMOS image sensor 1 relatively increase, because it needs to ensure an input range corresponding to the signal amount of the pixel 20, and thus needs to set the power supply voltage $V_{DD}$ to be relatively higher.

[Semiconductor Chip Structure]

As the semiconductor chip structure of the CMOS image sensor 1 having the above configuration, a flat-type semiconductor chip structure and a stacked-type semiconductor chip structure can be applied as an example. Furthermore, regarding the pixel structure, when the substrate surface on the side on which a wiring layer is formed is defined as a front surface (front), a back-illuminated pixel structure which receives light emitted from the back surface side opposite to the front surface can be employed, or a front-illuminated pixel structure which receives light emitted from the front surface side can be employed.

The flat-type semiconductor chip structure and the stacked-type semiconductor chip structure will be schematically described below.

(Flat-Type Semiconductor Chip Structure)

Figure 4A:
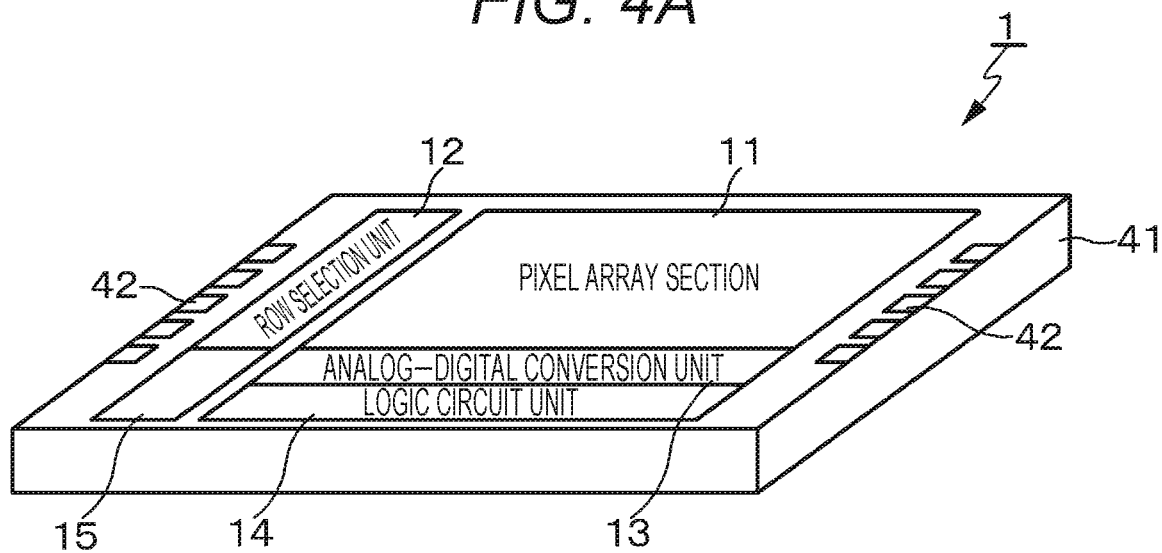
FIG. 4A is a perspective view schematically illustrating a flat-type chip structure.

FIG. 4A is a perspective view schematically illustrating a flat-type chip structure of the CMOS image sensor 1. As illustrated in FIG. 4A, the flat-type semiconductor chip structure has the pixel array section 11 which includes the pixels 20 arrayed in a matrix and the peripheral circuit section of the pixel array section 11. The pixel array section 11 is formed on a semiconductor substrate 41, and components of the peripheral circuit section are formed on the same semiconductor substrate 41. Specifically, the row selection unit 12, the analog-digital conversion unit 13, the logic circuit unit 14, the timing controller 15, and the like are formed on the semiconductor substrate 41 on which the pixel array section 11 is formed. Pads 42 for external connection and power supply are provided, for example, at both left and right ends of the semiconductor chip 41 in the first layer.

(Stacked-Type Semiconductor Chip Structure)

Figure 4B:
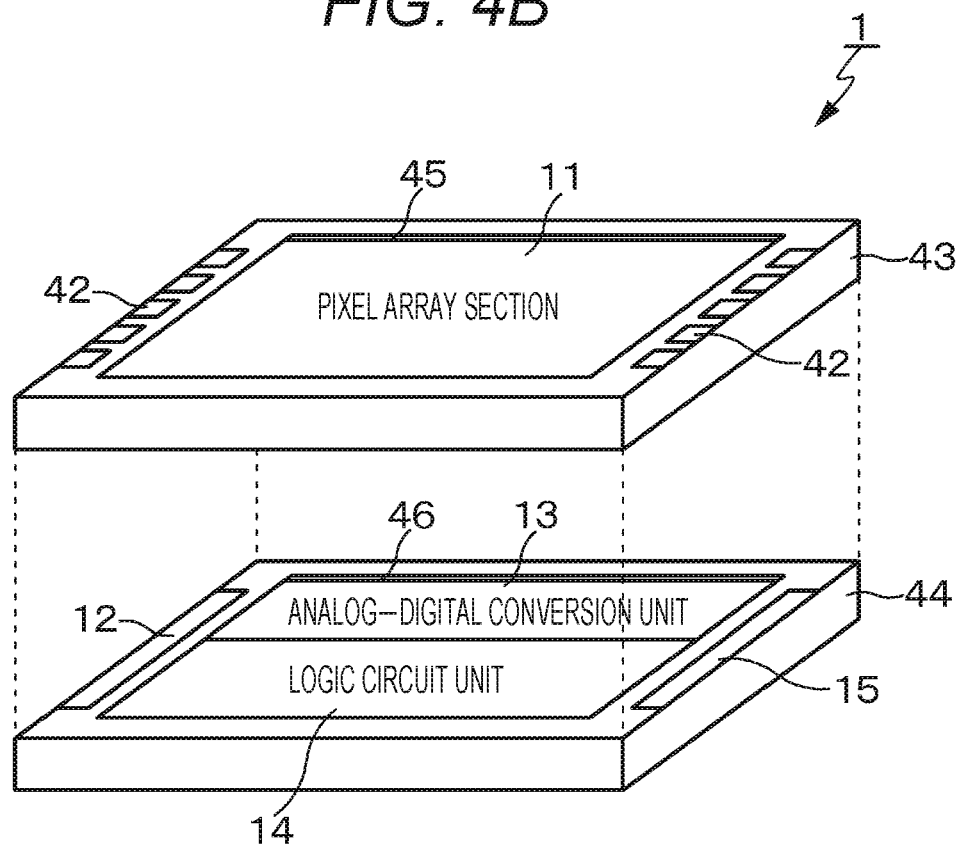
FIG. 4B is an exploded perspective view schematically illustrating a stacked-type semiconductor chip structure.

FIG. 4B is an exploded perspective view schematically illustrating a stacked-type semiconductor chip structure of the CMOS image sensor 1. As illustrated in FIG. 4B, the stacked semiconductor chip structure, that is, the stacked structure has a structure in which at least two semiconductor chips which are a semiconductor chip 43 in the first layer and a semiconductor chip 44 in the second layer are stacked.

In the stacked-type chip structure, the semiconductor chip 43 in the first layer is a pixel chip including a pixel array section 11 in which pixels 20 including photoelectric conversion elements (for example, photodiodes 21) are two-dimensionally arrayed in a matrix. Pads 42 for external connection and power supply are provided, for example, at both left and right ends of the semiconductor chip 43 in the first layer.

The semiconductor chip 44 in the second layer is a circuit chip in which a peripheral circuit section of the pixel array section 11, that is, the row selection unit 12, the analog-digital conversion unit 13, the logic circuit unit 14, the timing controller 15, and the like are formed. Note that the arrangement of the row selection unit 12, the analog-digital conversion unit 13, the logic circuit unit 14, and the timing controller 15 is an example, and is not limited to this arrangement example.

The pixel array section 11 on the semiconductor chip 43 in the first layer and the peripheral circuit section on the semiconductor chip 44 in the second layer are electrically connected via joints 72 and 73 including a metal-metal junction including a Cu—Cu junction, a through silicon via (TSV), a microbump, and the like.

According to the stacked-type semiconductor chip structure described above, a process suitable for manufacturing the pixel array section 11 can be applied to the semiconductor chip 43 in the first layer, and a process suitable for manufacturing the circuit section can be applied to the semiconductor chip 44 in the second layer. Thus, the process can be optimized during manufacture of the CMOS image sensor 1. Thus, the process can be optimized during manufacture of the CMOS image sensor 1. In particular, an advanced process can be applied to manufacture the circuit section.

EMBODIMENT OF PRESENT DISCLOSURE

The CMOS image sensor 1 according to the embodiment of the present disclosure has a circuit configuration in which the comparator 131 of the analog-digital converter 130 is a single comparator having a differential amplifier configuration, and the comparator 131 is provided between a load current source that supplies a current to the signal line 32 and the signal line 32. That is, the CMOS image sensor 1 according to the present embodiment has a circuit configuration in which a load current source that supplies a current to the signal line 32 is shared as a current source used in the comparator 131. According to the comparator 131 having the circuit configuration described above, it is possible to reduce the power consumption of the analog-digital converter 130 and thus the power consumption of the CMOS image sensor 1.

The CMOS image sensor 1 according to the present embodiment further includes a negative capacitance circuit that achieves a negative capacitance in terms of a circuit. The negative capacitance circuit is connected to the signal line 32, and applies the voltage of the signal line 32 to a common connection node of two cascode-connected transistors constituting the load current source via a capacitive element without logic inversion. The wiring capacitance of the signal line 32 can be reduced by the action of the negative capacitance circuit. In addition, due to a decrease in the wiring capacitance of the signal line 32, the settling speed of the pixel signal transmitted by the signal line 32 can be increased, and thus, the frame rate can be improved.

Hereinafter, a specific example of the comparator 131 according to the embodiment of the present disclosure will be described below. The comparator 131 has a circuit configuration in which a load current source that supplies a current to the signal line 32 is shared as a current source of the comparator 131 for the purpose of reducing power consumption, and includes a negative capacitance circuit connected to the signal line 32 for the purpose of increasing the setting speed of a pixel signal.

Example 1

Figure 5:
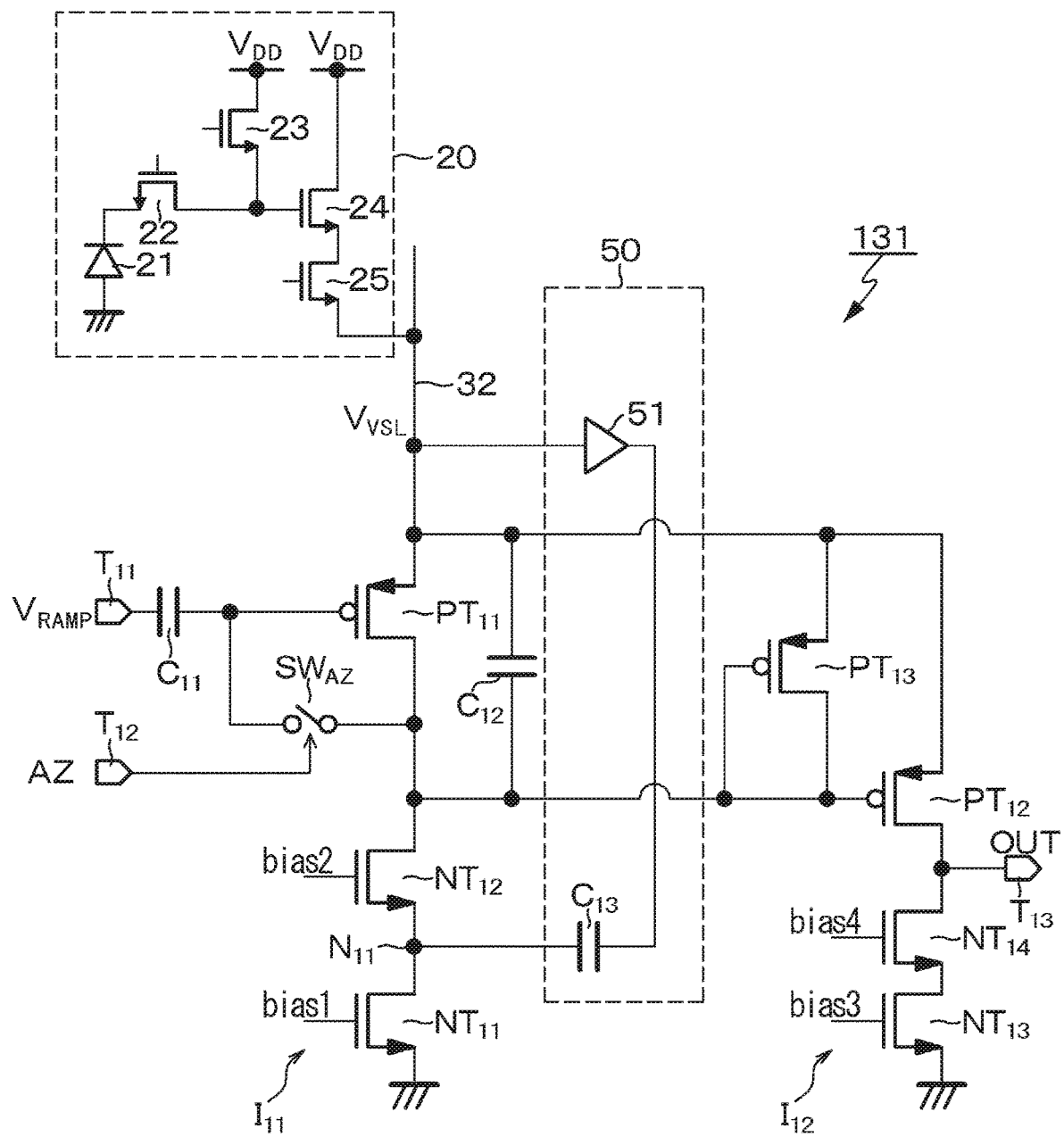
FIG. 5 is a circuit diagram illustrating an example of a circuit configuration of a comparator according to Example 1.

Example 1 describes an example of a basic circuit configuration of the comparator 131 in which a negative capacitance circuit is connected to a load current source of an input stage (first stage) of the comparator 131. FIG. 5 illustrates a circuit configuration example of the comparator according to Example 1. FIG. 5 illustrates the circuit configuration for one pixel column in order to simplify the illustration. The same applies to Examples to be described later.

(Example of Circuit Configuration of Comparator)

The comparator 131 according to Example 1 includes a first capacitive element $C_{11}$, an input transistor $PT_{11}$, an input-side load current source $I_{11}$, a second capacitive element $C_{12}$, an output transistor $PT_{12}$, an output-side load current source $I_{12}$, a clamp transistor $PT_{13}$, an auto-zero switch $SW_{AZ}$ and a negative capacitance circuit 50.

The input transistor $PT_{11}$ includes a P-channel MOS transistor, and is connected between the signal line 32 and the input-side load current source $I_{11}$. Specifically, a source electrode of the input transistor $PT_{11}$ is connected to the signal line 32, and a drain electrode is connected to one end of the input-side load current source $I_{11}$. As a result, the pixel signal $V_{VSL}$ is input to the source electrode of the input transistor $PT_{11}$ through the signal line 32.

The other end of the input-side load current source $I_{11}$ is connected to a low-potential-side power supply, for example, the ground GND. The input-side load current source $I_{11}$ includes two cascode-connected transistors, that is, a current source transistor $NT_{11}$ and a cascode transistor $NT_{12}$. A predetermined bias voltage bias1 is applied to a gate electrode of the current source transistor $NT_{11}$, and a predetermined bias voltage bias2 is applied to a gate electrode of the cascode transistor $NT_{12}$. As a result, the input-side load current source $I_{11}$ supplies a constant current to the series connection circuit of the input transistor $PT_{11}$ and the signal line 32. As the current source transistor $NT_{11}$ and the cascode transistor $NT_{12}$, N-channel MOS transistors can be used, for example.

The first capacitive element $C_{11}$ is connected between an input terminal $T_{11}$ for the ramp wave reference signal $V_{RAMP}$ and a gate electrode of the input transistor $PT_{11}$, and serves as an input capacitance to the reference signal $V_{RAMP}$. As a result, the pixel signal $V_{VSL}$ is input to the source electrode of the input transistor $PT_{11}$ through the signal line 32, and the ramp wave reference signal $V_{RAMP}$ is input to the gate electrode of the input transistor $PT_{11}$ through the first capacitive element $C_{11}$.

The input transistor $PT_{11}$ amplifies a difference between the reference signal $V_{RAMP}$ input to the gate electrode and the pixel signal $V_{VSL}$ input to the source electrode, that is, a gate-source voltage $V_{gs}$ of the input transistor $PT_{11}$, and outputs the amplified difference as a drain voltage from the drain electrode.

The auto-zero switch $SW_{AZ}$ is connected between the gate electrode and the drain electrode of the input transistor $PT_{11}$, and is controlled to be turned on (closed) or off (opened) by a drive signal AZ input from the timing controller 15 illustrated in FIG. 1 via an input terminal $T_{12}$. The auto-zero switch $SW_{AZ}$ is turned on to perform autozeroing (initialization operation) for short-circuiting the gate electrode and the drain electrode of the input transistor $PT_{11}$. The auto-zero switch $SW_{AZ}$ can be formed using a P-channel or N-channel MOS transistor.

The second capacitive element $C_{12}$ is connected in parallel to the input transistor $PT_{11}$. Specifically, one end of the second capacitive element $C_{12}$ is connected to the source electrode of the input transistor $PT_{11}$, and the other end of the second capacitive element $C_{12}$ is connected to the drain electrode of the input transistor $PT_{11}$.

The output transistor $PT_{12}$ includes, for example, a P-channel MOS transistor, and is connected between the signal line 32 and the output-side load current source $I_{12}$. Specifically, a source electrode of the output transistor $PT_{12}$ is connected to the signal line 32, and a drain electrode is connected to one end of the output-side load current source $I_{12}$. Thus, the pixel signal $V_{VSL}$ is input to the source electrode of the output transistor $PT_{12}$ through the signal line 32.

The other end of the output-side load current source $I_{12}$ is connected to a low-potential-side power supply, for example, the ground GND. The output-side load current source $I_{12}$ includes two cascode-connected transistors, that is, a current source transistor $NT_{13}$ and a cascode transistor $NT_{14}$. A predetermined bias voltage bias3 is applied to a gate electrode of the current source transistor $NT_{13}$, and a predetermined bias voltage bias4 is applied to a gate electrode of the cascode transistor $NT_{14}$. As a result, the output-side load current source $I_{12}$ supplies a constant current to the series connection circuit of the output transistor $PT_{12}$ and the signal line 32. As the current source transistor $NT_{13}$ and the cascode transistor $NT_{14}$, N-channel MOS transistors can be used, for example.

A gate electrode of the output transistor $PT_{12}$ is connected to the drain electrode of the input transistor $PT_{11}$. Thus, the drain voltage of the input transistor $PT_{11}$ is input to the gate electrode of the output transistor $PT_{12}$.

The output transistor $PT_{12}$ outputs a signal OUT indicating whether or not a voltage difference between the pixel signal $V_{VSL}$ input to the source electrode through the signal line 32 and the drain voltage of the input transistor $PT_{11}$ input to the gate electrode exceeds a predetermined threshold voltage from the drain electrode through an output terminal T13 as a comparison result between the analog pixel signal $V_{VSL}$ and the ramp wave reference signal $V_{RAMP}$.

The clamp transistor $PT_{13}$ includes, for example, a P-channel MOS transistor, and is connected between the source electrode and the drain electrode of the input transistor $PT_{11}$. The clamp transistor $PT_{13}$ has a diode-connected configuration in which a gate electrode and a source electrode are commonly connected, and has an action of suppressing a decrease in the drain voltage of the input transistor $PT_{11}$ when the input transistor $PT_{11}$ is in a non-conductive state.

As described above, the comparator 131 according to Example 1 has a basic circuit configuration in which the load current source $I_{11}$ that supplies a current to the signal line 32 is shared as a current source of the comparator 131. According to the comparator 131 having the basic circuit configuration described above, it is possible to reduce the power consumption of the analog-digital converter 130 and thus the power consumption of the CMOS image sensor 1. Furthermore, since the input transistor $PT_{11}$ supplies the drain-source voltage between the gate and the source of the output transistor $PT_{12}$, the comparison result can be inverted at a timing at which the analog pixel signal $V_{VSL}$ coincides with the ramp wave reference signal $V_{RAMP}$. As a result, noise caused by an error in the inversion timing can be reduced, and the image quality of the image data can be improved.

(Example of Circuit Operation of Comparator)

Figure 6:
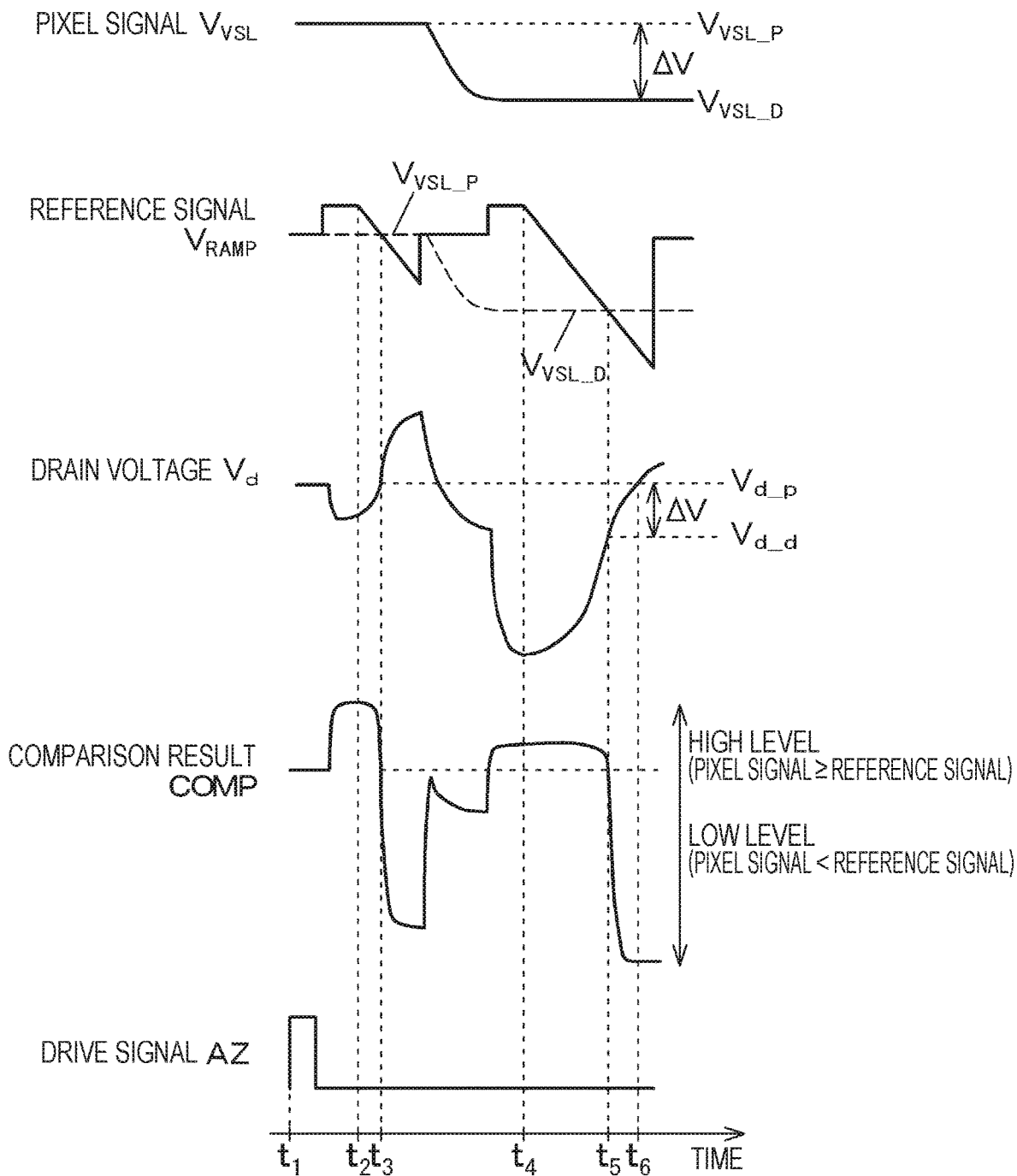
FIG. 6 is a timing chart for describing an example of the circuit operation of the comparator having a basic circuit configuration.

Next, an example of a circuit operation of the comparator 131 having the above-described basic circuit configuration will be described. FIG. 6 is a timing chart for describing an example of the circuit operation of the comparator 131 according to Example 1. The timing chart of FIG. 6 illustrates a timing relationship of waveforms of the analog pixel signal $V_{VSL}$, the ramp wave reference signal $V_{RAMP}$, the drain voltage $V_d$ of the input transistor $PT_{11}$, the comparison result COMP of the comparator 131, and the drive signal AZ of the auto-zero switch $SW_{AZ}$.

The drive signal AZ of the auto-zero switch $SW_{AZ}$ enters an active state (high-level state) during a predetermined auto-zero period at time $t_1$ immediately before the start of the analog-digital conversion (AD conversion). As a result, the auto-zero switch $SW_{AZ}$ is turned on (closed) in response to the drive signal AZ, thereby short-circuiting the gate electrode and the drain electrode of the input transistor $PT_{11}$, and performing the initialization operation of the comparator 131, that is, autozeroing.

After the autozeroing, the reference signal generation unit 16 starts outputting the reference signal $V_{RAMP}$ at time t2. The reference signal $V_{RAMP}$ is a ramp wave signal whose level (voltage) monotonously decreases with time.

Meanwhile, in the CMOS image sensor 1, noise removal processing by correlated double sampling (CDS) is generally performed in order to remove noise at the time of a reset operation of the pixel 20. Therefore, a reset level (P-phase) $V_{VSL\_P}$ and a signal level (D-phase) $V_{VSL\_D}$ are read from the pixel 20 as the pixel signal, for example.

The reset level $V_{VSL\_P}$ corresponds to a potential of the floating diffusion FD when the floating diffusion FD of the pixel 20 is reset. The signal level $V_{VSL\_D}$ corresponds to a potential obtained by photoelectric conversion in the photodiode 21, that is, a potential of the floating diffusion FD when the charge accumulated in the photodiode 21 is transferred to the floating diffusion FD.

It is assumed that, at time $t_3$, the reference signal $V_{RAMP}$ whose voltage gradually decreases with the lapse of time intersects with the reset level $V_{VSL\_P}$. Here, when the drain voltage $V_d$ of the input transistor $PT_{11}$ at time $t_3$ is $V_{d\_p}$, a voltage lower than the drain voltage $V_{d\_p}$ is a low level, and a voltage equal to or higher than the drain voltage $V_{d\_p}$ is a high level, the drain voltage $V_d$ of the input transistor $PT_{11}$ is inverted from the low level to the high level at time $t_3$.

Thereafter, the reference signal $V_{RAMP}$ is initialized, and the reference signal $V_{RAMP}$ gradually decreases from time t4. On the other hand, in the pixel 20, electric charge is transferred from the photodiode 21 to the floating diffusion FD, and a signal level $V_{VSL\_D}$ is output as a pixel signal. The signal level $V_{VSL\_D}$ is set to a level lower than the reset level $V_{VSL\_P}$ by $\Delta V$.

Then, it is assumed that, at time $t_5$, the reference signal $V_{RAMP}$ whose voltage gradually decreases with the lapse of time intersects with the signal level $V_{VSL\_D}$. Here, the drain voltage $V_d$ of the input transistor $PT_{11}$ at time $t_5$ is defined as $V_{d\_d}$. The drain voltage $V_{d\_d}$ is lower than the drain voltage $V_{d\_p}$ by $\Delta V$. That is, the drain voltage $V_{d\_d}$ at time $t_5$ has a lower value as the signal level $V_{VSL\_D}$ which is the pixel signal at that time is lower.

The drain voltage $V_{d\_d}$ of the input transistor $PT_{11}$ drops by $\Delta V$ from the drain voltage $V_{d\_p}$ at the time of conversion of the reset level $V_{VSL\_P}$. In the prior art, it is determined that the drain voltage $V_d$ is inverted at time to after time $t_5$. Therefore, if the drain voltage $V_d$ is used as the comparison result COMP of the comparator 131, the timing (time to) at which the comparison result COMP is inverted deviates from the ideal timing (time $t_5$) at which the reference signal $V_{RAMP}$ intersects the signal level $V_{VSL\_D}$. As a result, a linearity error or an offset occurs in the analog-digital converter 130, and the image quality of the image data may be deteriorated due to this error.

On the other hand, in the comparator 131 according to Example 1, the output transistor $PT_{12}$ is provided at the subsequent stage of the input transistor $PT_{11}$, and the source electrode and the drain electrode of the input transistor $PT_{11}$ are connected to the source electrode and the gate electrode of the output transistor $PT_{12}$. With this connection, the drain-source voltage $V_{ds}$ of the input transistor $PT_{11}$ is input to the output transistor $PT_{12}$ as the gate-source voltage thereof.

As illustrated in the timing chart of FIG. 6, the voltage drop amount $\Delta V$ of the pixel signal $V_{VSL}$ is the same as the voltage drop amount of the drain voltage $V_d$ of the input transistor $PT_{11}$ at time $t_3$ and time ty at which the reference signal $V_{RAMP}$ intersects the pixel signal $V_{VSL}$. Therefore, the drain-source voltage $V_{ds}$ has the same value at these timings. The value of the drain-source voltage $V_{ds}$ at this time (that is, time $t_3$ and time $t_5$) is the same as that during autozeroing.

Since the drain-source voltage $V_{ds}$ of the input transistor $PT_{11}$ is the gate-source voltage of the output transistor $PT_{12}$, the drain voltage of the output transistor $PT_{12}$ is inverted at time $t_3$ and time $t_5$.

Since the inversion timing of the comparison result COMP of the comparator 131 is an ideal timing at which the reference signal $V_{RAMP}$ intersects the signal level $V_{VSL\_D}$, an error in the inversion timing is suppressed. As a result, the linearity error and the offset can be reduced, and the image quality of the image data can be improved, as compared with a case where the drain voltage $V_d$ of the input transistor $PT_{11}$ is used as the comparison result COMP.

Next, the reason that the voltage drop amount $\Delta V$ of the drain voltage $V_d$ of the input transistor $PT_{11}$ is the same as the voltage drop amount of the pixel signal $V_{VSL}$ input to the source electrode of the input transistor $PT_{11}$ at time $t_3$ and time $t_5$ will be described.

Figure 7:
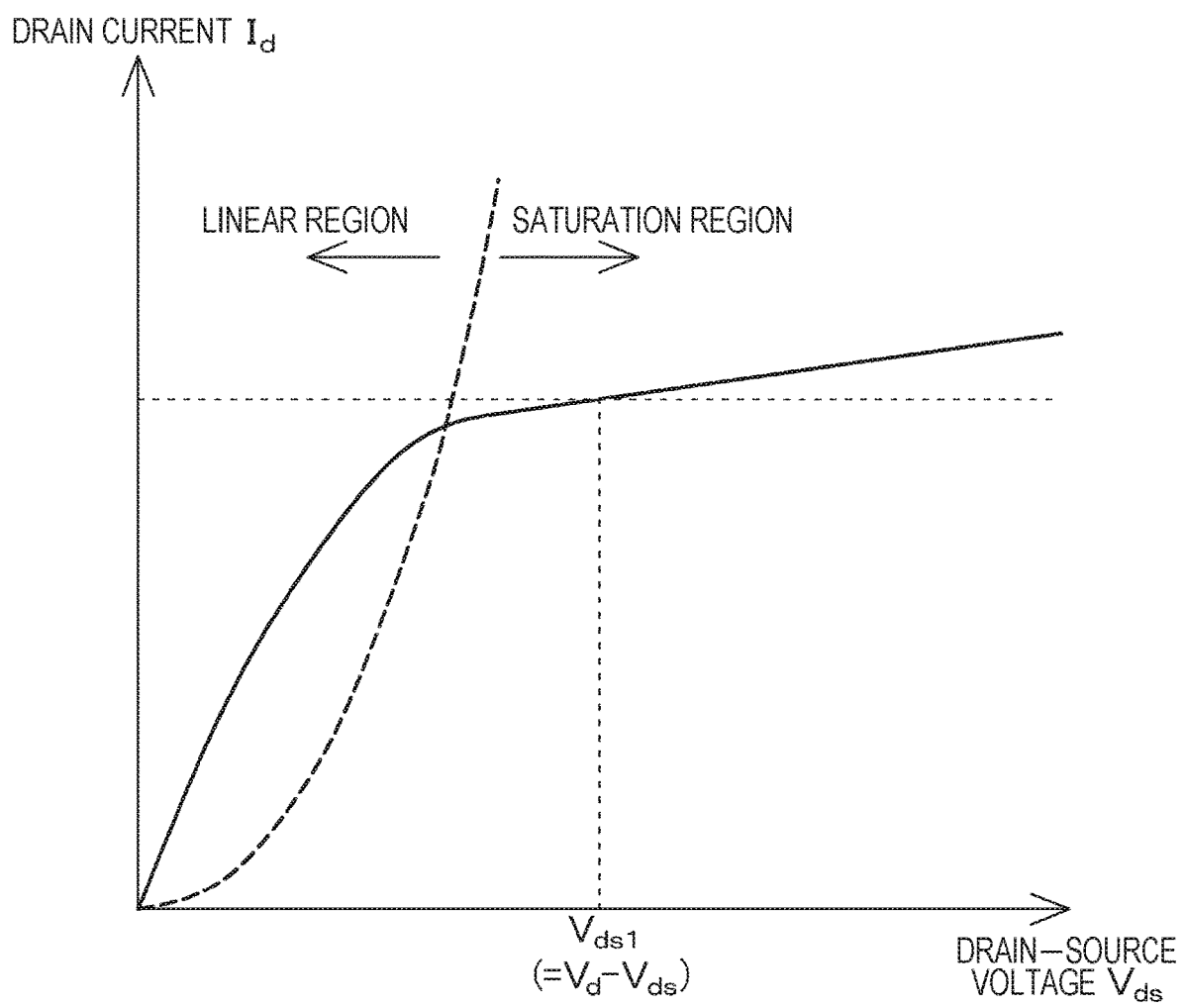
FIG. 7 is a characteristic diagram illustrating an example of characteristics of a P-channel MOS transistor.

FIG. 7 is a characteristic diagram illustrating an example of characteristics of a P-channel MOS transistor used as the input transistor $PT_{11}$ in the comparator 131 according to Example 1. In the characteristic diagram of FIG. 8, the vertical axis represents drain current, and the horizontal axis represents drain-source voltage. In addition, a broken line indicates a boundary between a linear region and a saturation region.

Commonly, an operating point of a P-channel MOS transistor is determined so that the P-channel MOS transistor operates in the saturation region during autozeroing. A drain current $I_d$ in the saturation region of the P-channel MOS transistor is expressed by following Equation (1).

$$I_d = (1/2) \cdot \mu C_{OX}(W/L) \cdot (V_{GS} - V_{th})^2 (1 + \lambda V_{ds}) \quad (1)$$

Here, $\mu$ is electron mobility, $C_{OX}$ is capacitance per unit area of the MOS capacitor, W is a gate width, L is a gate length, $V_{th}$ is a threshold voltage, and $\lambda$ is a predetermined coefficient.

Since the input transistor $PT_{11}$ is a P-channel MOS transistor, Equation (1) is established in the saturation region. At this time, the drain current $I_d$ of the input transistor $PT_{11}$K has a constant value $I_{d1}$ supplied by the input-side load current source $I_{11}$. In addition, the electron mobility u, the unit capacitance $C_{OX}$, the gate width W, the gate length L, the threshold voltage $V_{th}$, and the coefficient $\lambda$ are constant values.

Furthermore, when the reference signal $V_{RAMP}$ input to the gate electrode of the input transistor $PT_{11}$ intersects the pixel signal $V_{VSL}$ input to the source electrode, the gate-source voltage $V_{gs}$ has a constant value determined during autozeroing.

Therefore, when the reference signal $V_{RAMP}$ input to the gate electrode of the input transistor $PT_{11}$ intersects the pixel signal $V_{VSL}$ input to the source electrode, the drain-source voltage $V_{ds}$ also has a constant value according to Equation (1). Assuming that the constant drain-source voltage is $V_{ds1}$, following Equations (2) and (3) are established at time $t_3$ and time $t_5$.

$$V_{ds1} = V_{VSL\_P} - V_{d\_p} \quad (2)$$

$$V_{ds1} = V_{VSL\_D} - V_{d\_d} \quad (3)$$

When the drain-source voltage $V_{ds1}$ is deleted from Equations (2) and (3), following Equation (4) is obtained.

$$V_{VSL\_P} - V_{d\_p} = V_{d\_p} - V_{d\_d} \quad (4)$$

Note that, in a case where the operating point is determined so that the P-channel MOS transistor operates in a linear region during autozeroing, Equation (1) has a different form, but Equation (4) similarly holds.

From Equation (4), the voltage drop amount $\Delta V$ of the drain voltage $V_d$ of the input transistor $PT_{11}$ is equal to the voltage drop amount of the pixel signal $V_{VSL}$ input to the source electrode. Therefore, the timing relationship illustrated in the timing chart of FIG. 6 can be obtained.

(Negative Capacitance Circuit)

In the basic circuit configuration described above, the comparator 131 according to Example 1 includes the negative capacitance circuit 50 connected to the signal line 32. The negative capacitance circuit 50 includes a non-inverting amplifier 51 and a capacitive element $C_{13}$. One end of the capacitive element $C_{13}$ is connected to a common connection node $N_{11}$ of two cascode-connected transistors ($NT_{11}$, $NT_{12}$) constituting the load current source $I_{11}$. The non-inverting amplifier 51 has an input end connected to the signal line 32 and an output end connected to the other end of the capacitive element $C_{13}$.

The negative capacitance circuit 50 including the non-inverting amplifier 51 applies the voltage of the signal line 32 to the common connection node $N_{11}$ of the two cascode-connected transistors ($NT_{11}$, $NT_{12}$) constituting the load current source $I_{11}$ of the input stage via the capacitive element $C_{13}$ without logic inversion. The negative capacitance circuit 50 can reduce the wiring capacitance of the signal line 32 by achieving a negative capacitance in terms of a circuit, in other words, functioning as a circuit having negative capacitance.

In general, when a parasitic capacitance is generated in the signal line 32 and the wiring capacitance increases, the settling time until the potential of the signal line 32 becomes constant increases due to the increase in the wiring capacitance, resulting in that the reading speed of the pixel signal may decrease. On the other hand, in the comparator 131 according to Example 1, the negative capacitance circuit 50 is connected to the signal line 32, by which the wiring capacitance of the signal line 32 can be reduced. Thus, the settling time of the potential of the signal line 32 can be shortened, and as a result, the frame rate can be improved.

Figure 8:
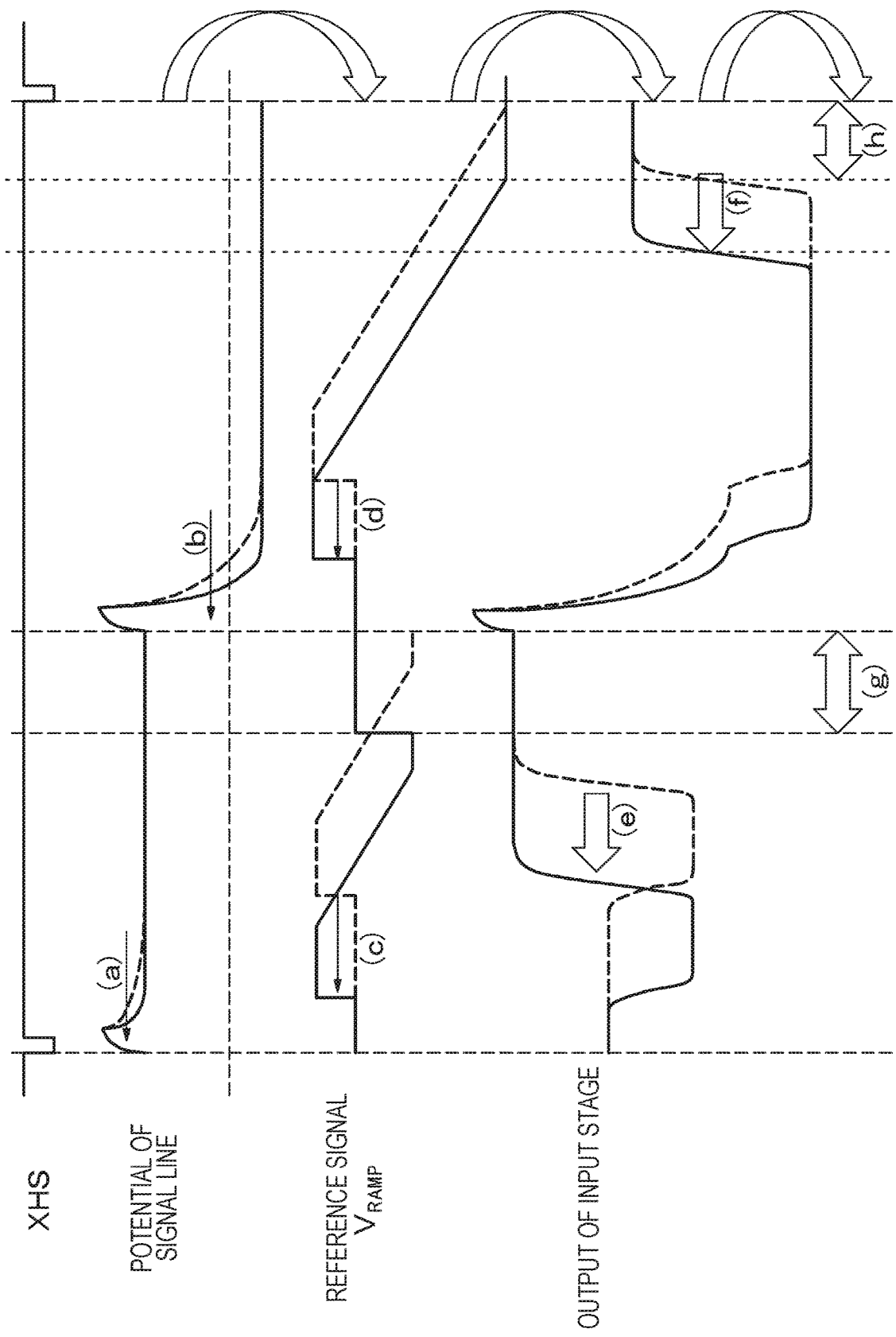
FIG. 8 is a timing waveform diagram for describing the fact that a frame rate can be improved by reducing wiring capacitance of a signal line.

The fact that the frame rate can be improved by reducing the wiring capacitance of the signal line 32 will be described with reference to a timing waveform diagram of FIG. 8. The timing waveform diagram in FIG. 8 illustrates a timing relationship among a horizontal synchronization signal XHS, the potential of the signal line 32, the ramp wave reference signal $V_{RAMP}$, and the output of the input stage (the input transistor $PT_{11}$) of the comparator 131.

The wiring capacitance of the signal line 32 can be reduced by the action of the negative capacitance circuit 50, whereby the settling time of the potential of the signal line 32 can be shortened as illustrated in FIGS. 8(a) and 8(b). In response to the decrease in setting time, the rise timing of the ramp wave reference signal $V_{RAMP}$ can be advanced as illustrated in FIGS. 8(c) and 8(d). Accordingly, the inversion timing of the output of the input stage of the comparator 131, that is, the output of the input transistor $PT_{11}$, is advanced as illustrated in FIGS. 8(e) and 8(f). As a result, a margin of timing is enlarged as illustrated in FIGS. 8(g) and 8(h), and the reading speed of the pixel signal can be increased, that is, the frame rate can be improved.

Regarding the reduction of the wiring capacitance of the signal line 32, the wiring capacitance of the signal line 32 can be reduced by changing the material of the signal line 32 to a material having a low dielectric constant or refining a process rule. However, such a process takes a lot of time and cost for development and presents difficulties. On the other hand, according to the configuration in which the negative capacitance circuit 50 is connected to the signal line 32 as in the comparator 131 according to Example 1, it is not necessary to change the material of the signal line 32, and thus, a decrease in wiring capacitance of the signal line 32 can be easily achieved.

Example 2

Figure 9:
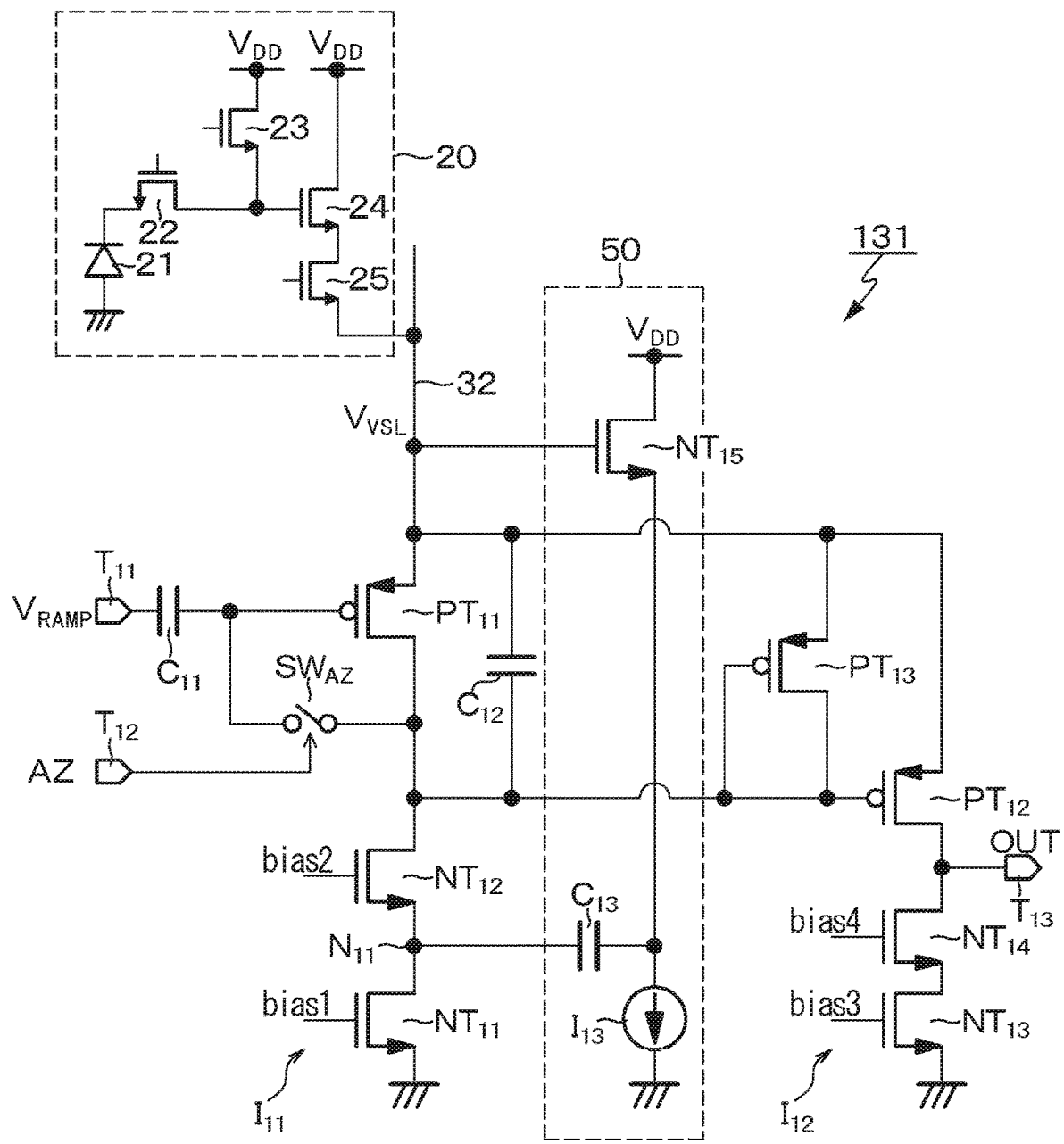
FIG. 9 is a circuit diagram illustrating an example of a circuit configuration of a comparator according to Example 2.

Example 2 is a modification of Example 1, and provides a specific circuit example of the negative capacitance circuit 50. FIG. 9 illustrates a circuit configuration example of the comparator 131 according to Example 2 including a specific circuit example of the negative capacitance circuit 50.

In the comparator 131 according to Example 2, the negative capacitance circuit 50 includes an N-channel MOS transistor $NT_{15}$ and a current source $I_{13}$ in addition to the capacitive element $C_{13}$. The N-channel MOS transistor $NT_{15}$ and the current source $I_{13}$ constitute the non-inverting amplifier 51 of Example 1. The same applies to Examples to be described later.

In the negative capacitance circuit 50, the N-channel MOS transistor $NT_{15}$ has a gate electrode connected to the signal line 32 and a drain electrode connected to a node of the high-potential-side power supply voltage $V_{DD}$. One end of the capacitive element $C_{13}$ is connected to the common connection node $N_{11}$ of the current source transistor $NT_{11}$ and the cascode transistor $NT_{12}$ of the input-side load current source $I_{11}$, and the other end is connected to a source electrode of the N-channel MOS transistor $NT_{15}$. The current source $I_{13}$ is connected between the source electrode of the N-channel MOS transistor $NT_{15}$ and a low-potential-side power supply (for example, ground).

The comparator 131 according to Example 2 in which the non-inverting amplifier 51 is constituted by the N-channel MOS transistor $NT_{15}$ and the current source $I_{13}$ can also provide operations and effects similar to those of the comparator 131 in Example 1. That is, the wiring capacitance of the signal line 32 can be reduced by the action of the negative capacitance circuit 50, whereby the settling time of the potential of the signal line 32 can be shortened, and as a result, the frame rate can be improved.

Example 3

Figure 10:
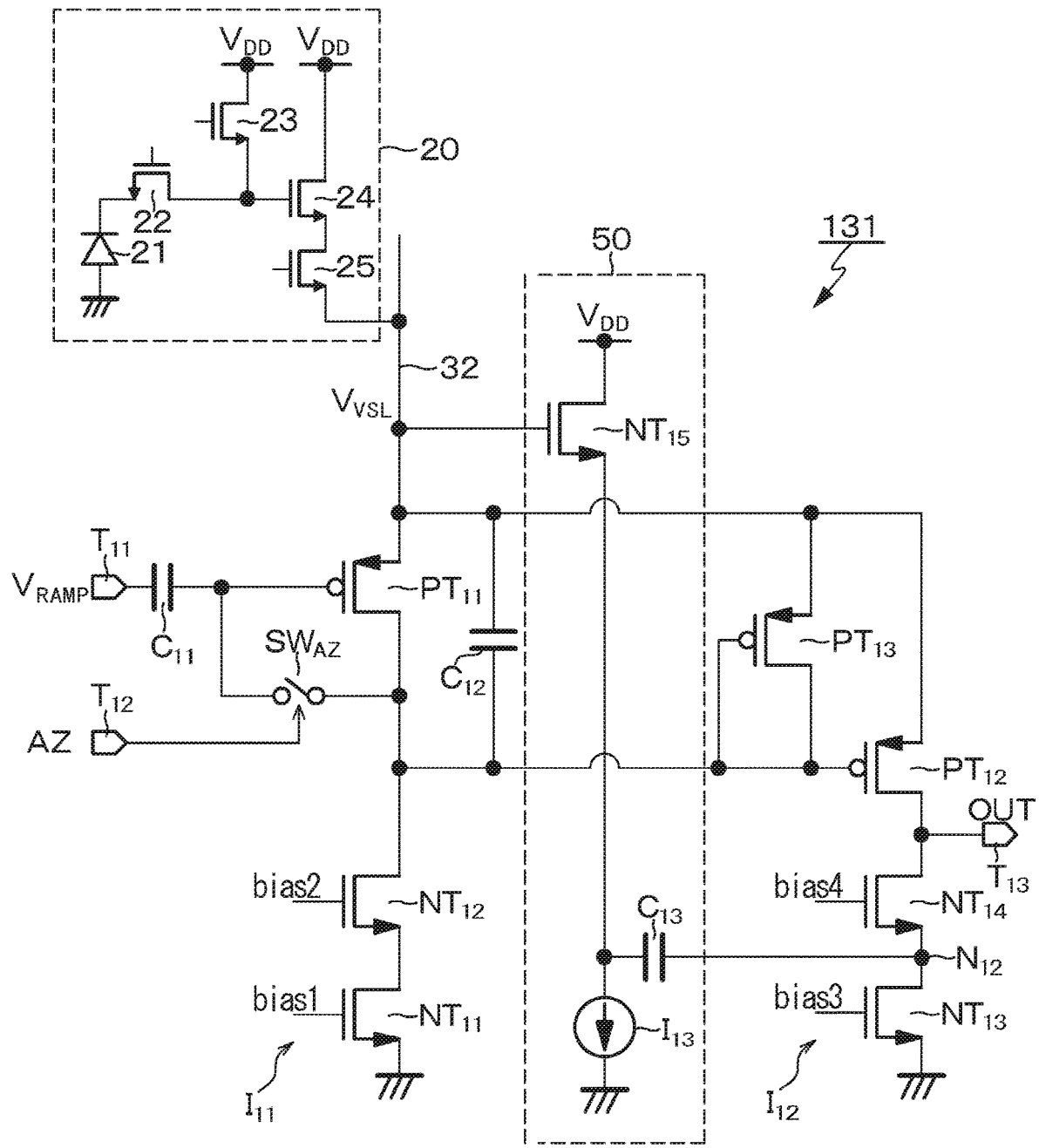
FIG. 10 is a circuit diagram illustrating an example of a circuit configuration of a comparator according to Example 3.

Example 3 describes an example in which the negative capacitance circuit 50 is connected to a load current source of an output stage (second stage) of the comparator 131. FIG. 10 illustrates an example of a circuit configuration of Automobile_templatel_ver_1.0 of the comparator 131 according to Example 3.

In the comparator 131 according to Example 3, the negative capacitance circuit 50 including the N-channel MOS transistor $NT_{15}$, the current source $I_{13}$, and the capacitive element $C_{13}$ is connected to the output-side load current source $I_{12}$ of the output stage (second stage) of the comparator 131. Specifically, in the negative capacitance circuit 50, one end of the capacitive element $C_{13}$ is connected to a common connection node $N_{12}$ between the current source transistor $NT_{13}$ and the cascode transistor $NT_{14}$ of the load current source 112. The other end of the capacitive element $C_{13}$ is connected to the source electrode of the N-channel MOS transistor $NT_{15}$.

In the comparator 131 having the above circuit configuration according to Example 3, the negative capacitance circuit 50 applies the voltage of the signal line 32 to the common connection node $N_{12}$ of the two cascode-connected transistors ($NT_{13}$, $NT_{14}$) constituting the output-side load current source $I_{12}$ of the output stage via the capacitive element $C_{13}$ without logic inversion. As a result, operations and effects similar to those in Example 1 can be obtained. That is, the wiring capacitance of the signal line 32 can be reduced by the action of the negative capacitance circuit 50, whereby the settling time of the potential of the signal line 32 can be shortened, and as a result, the frame rate can be improved.

Example 4

Figure 11:
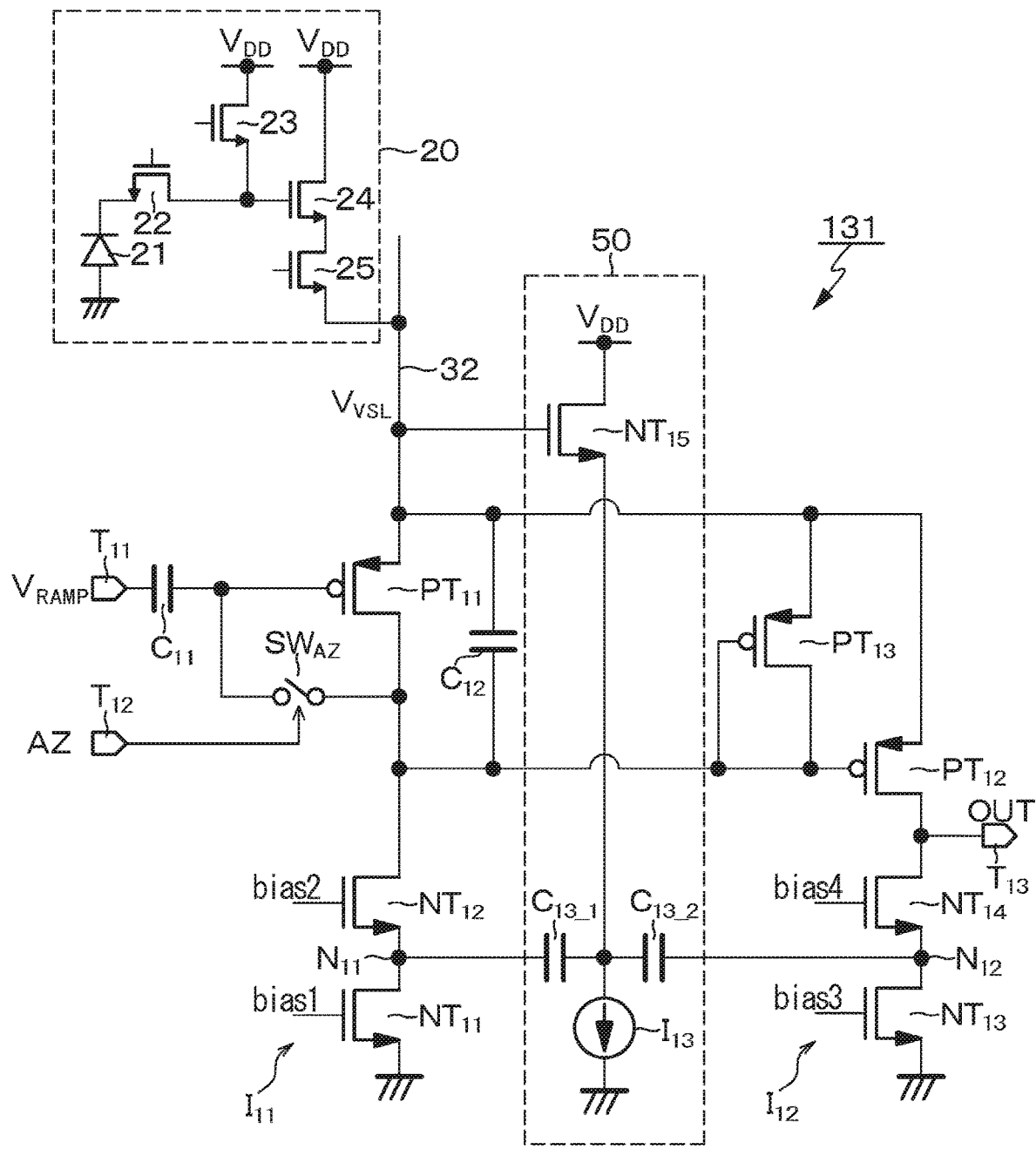
FIG. 11 is a circuit diagram illustrating an example of a circuit configuration of a comparator according to Example 4.

Example 4 describes an example in which the negative capacitance circuit 50 is connected to load current sources of an input stage and an output stage of the comparator 131. FIG. 11 illustrates a circuit configuration example of the comparator 131 according to Example 4.

In the comparator 131 according to Example 4, the negative capacitance circuit 50 includes two capacitive elements $C_{13\_1}$ and $C_{13\_2}$ as capacitive elements. One ends of the two capacitive elements $C_{13\_1}$ and $C_{13\_2}$ are connected to the source electrode of the N-channel MOS transistor $NT_{15}$. In addition, the other end of the capacitive element $C_{13\_1}$ is connected to the common connection node $N_{11}$ of the current source transistor $NT_{11}$ and the cascode transistor $NT_{12}$ of the input-side load current source $I_{11}$. In addition, the other end of the capacitive element $C_{13\_2}$ is connected to the common connection node $N_{12}$ of the current source transistor $NT_{13}$ and the cascode transistor $NT_{14}$ of the output-side load current source $I_{12}$.

In the comparator 131 having the above circuit configuration according to Example 4, the negative capacitance circuit 50 applies the voltage of the signal line 32 to the common connection node $N_{11}$ of the input-side load current source $I_{11}$ via the capacitive element $C_{13\_1}$ and to the common connection node $N_{12}$ of the output-side load current source $I_{12}$ via the capacitive element $C_{13\_2}$ without logic inversion. As a result, operations and effects similar to those in Example 1 can be obtained. That is, the wiring capacitance of the signal line 32 can be reduced by the action of the negative capacitance circuit 50, whereby the settling time of the potential of the signal line 32 can be shortened, and as a result, the frame rate can be improved.

Example 5

Figure 12:
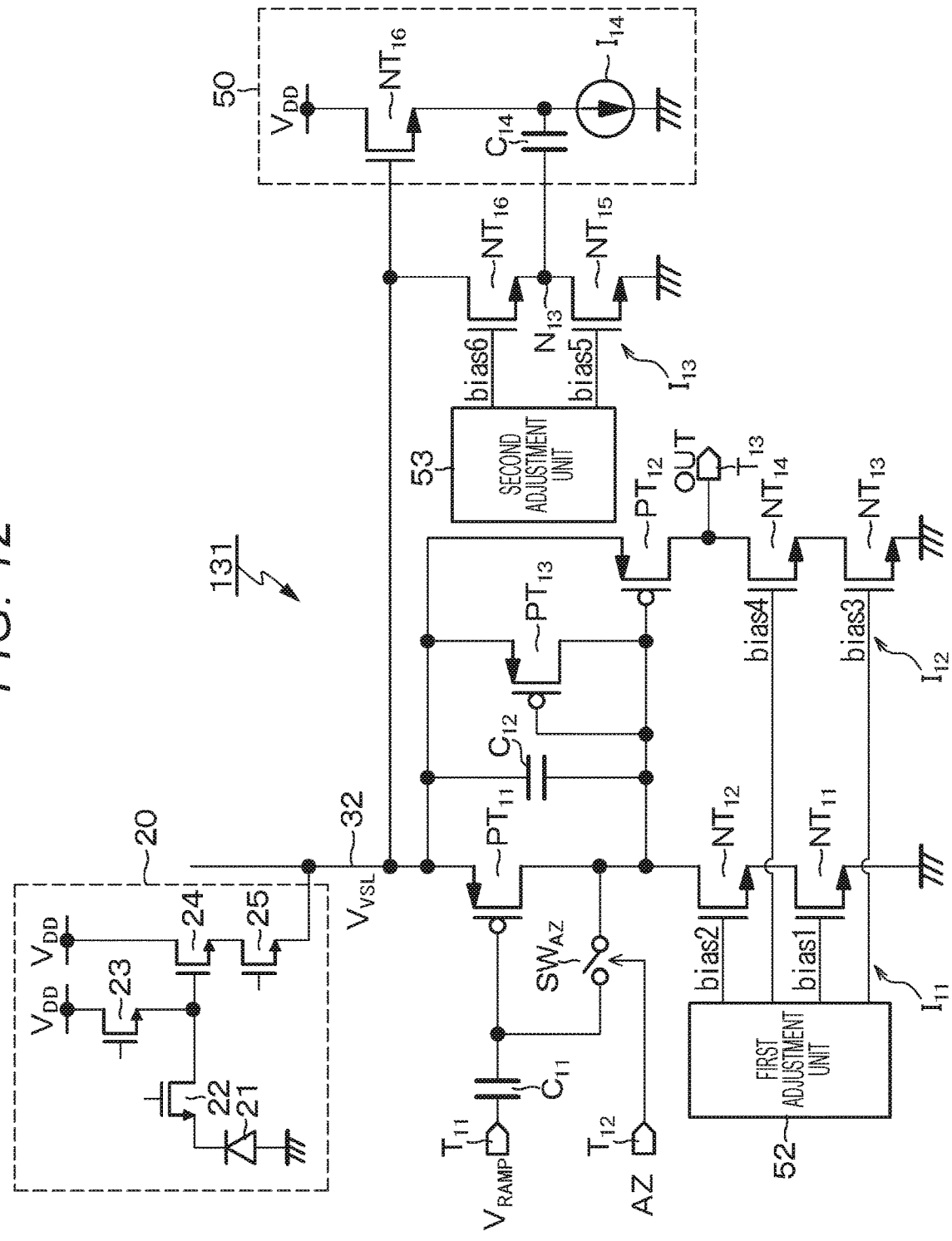
FIG. 12 is a circuit diagram illustrating an example of a circuit configuration of a comparator according to Example 5.

Example 5 describes an example of having a load current source for signal line. There is a case where it is desired to separately optimize the settling on the main body side of the comparator 131 and the settling of the signal line 32. In view of this, a load current source for the signal line 32 is provided separately from the load current source (the input-side load current source $I_{11}$ and the output-side load current source $I_{12}$) of the comparator 131. With this configuration, the settling on the main body side of the comparator 131 and the settling of the signal line 32 can be optimized separately. FIG. 12 illustrates a circuit configuration example of the comparator 131 according to Example 5.

As illustrated in FIG. 12, the comparator 131 according to Example 5 includes a load current source $I_{13}$ for signal line directly connected to the signal line 32 for the purpose of separately optimizing the settling on the main body side of the comparator 131 and the settling of the signal line 32. One end of the load current source $I_{13}$ is directly connected to the signal line 32, and the other end of the load current source $I_{13}$ is connected to a low-potential-side power supply, for example, the ground GND.

In the comparator 131 according to Example 5, a predetermined bias voltage bias1 is applied to the gate electrode of the current source transistor $NT_{11}$ of the input-side load current source $I_{11}$, and a predetermined bias voltage bias2 is applied to the gate electrode of the cascode transistor $NT_{12}$. A predetermined bias voltage bias3 is applied to the gate electrode of the current source transistor $NT_{13}$ of the output-side load current source $I_{12}$, and a predetermined bias voltage bias4 is applied to the gate electrode of the cascode transistor $NT_{14}$. The bias voltage bias1 to the bias voltage bias4 are given from a first adjustment unit 52. The first adjustment unit 52 can set a value of current flowing through the comparator 131 by adjusting each voltage value of the bias voltage bias1 to the bias voltage bias4.

The load current source $I_{13}$ for signal line includes two cascode-connected transistors, that is, a current source transistor $NT_{15}$ and a cascode transistor $NT_{16}$. A predetermined bias voltage bias5 is applied to a gate electrode of the current source transistor $NT_{15}$, and a predetermined bias voltage bias6 is applied to a gate electrode of the cascode transistor $NT_{16}$. As the current source transistor $NT_{15}$ and the cascode transistor $NT_{16}$, N-channel MOS transistors can be used, for example. The bias voltage bias5 and the bias voltage bias6 are given from a second adjustment unit 53. The second adjustment unit 53 can set a value of current flowing through the signal line 32 by adjusting each voltage value of the bias voltage bias5 and the bias voltage bias6.

A negative capacitance circuit 50 is further connected to the signal line 32. The negative capacitance circuit 50 includes an N-channel MOS transistor $NT_{16}$, a current source $I_{14}$, and a capacitive element $C_{14}$.

In the negative capacitance circuit 50, the N-channel MOS transistor $NT_{16}$ has a gate electrode connected to the signal line 32 and a drain electrode connected to a node of the high-potential-side power supply voltage $V_{DD}$. One end of the capacitive element $C_{14}$ is connected to a source electrode of the N-channel MOS transistor $NT_{16}$, and the other end is connected to a common connection node $N_{13}$ of the current source transistor $NT_{15}$ and the cascode transistor $NT_{16}$ of the load current source $I_{13}$. The current source $I_{14}$ is connected between the source electrode of the N-channel MOS transistor $NT_{15}$ and a low-potential-side power supply (for example, ground).

In the comparator 131 according to Example 5 having the circuit configuration described above, the first adjustment unit 52 adjusts the voltage values of the bias voltage bias1 to the bias voltage bias4, and the second adjustment unit 53 adjusts the voltage values of the bias voltage bias5 and the bias voltage bias6, so that the settling on the main body side of the comparator 131 and the settling of the signal line 32 can be separately optimized. For example, there may be a case where the user intends to increase the speed of settling of the signal line 32, but intends to reduce noise by narrowing the band of the comparator 131. In such a case, it is only sufficient that the value of current flowing through the comparator 131 is reduced by the first adjustment unit 52, and the value of current flowing through the signal line 32 is increased and boosted by the second adjustment unit 53.

The negative capacitance circuit 50 applies, via the capacitive element $C_{14}$, the voltage of the signal line 32 to the common connection node $N_{13}$ of the load current source $I_{13}$ for signal line provided for the purpose of separately optimizing the settling on the main body side of the comparator 131 and the settling of the signal line 32 without logic inversion. As a result, operations and effects similar to those in Example 1 can be obtained. That is, the wiring capacitance of the signal line 32 can be reduced by the action of the negative capacitance circuit 50, whereby the settling time of the potential of the signal line 32 can be shortened, and as a result, the frame rate can be improved.

Example 6

Figure 13:
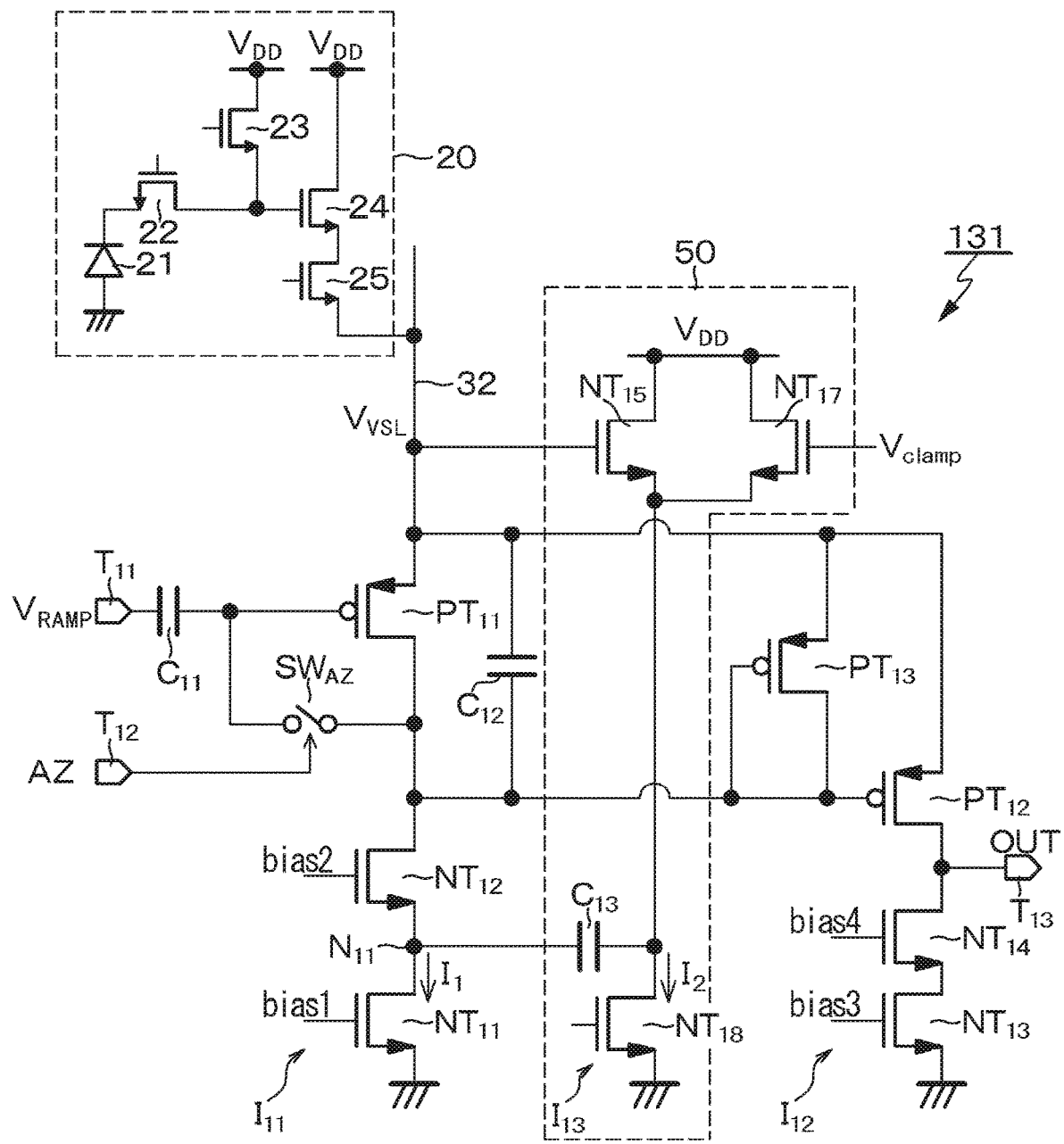
FIG. 13 is a circuit diagram illustrating an example of a circuit configuration of a comparator according to Example 6.

Example 6 describes an example of having a clamp transistor that clamps the voltage of the signal line 32 to a predetermined voltage. FIG. 13 illustrates a circuit configuration example of the comparator 131 according to Example 6.

As illustrated in FIG. 13, in the comparator 131 according to Example 6, a negative capacitance circuit 50 includes a clamp transistor $NT_{17}$ in addition to the components of the comparator 131 according to Example 2 illustrated in FIG. 9.

The clamp transistor $NT_{17}$ is connected in parallel to the N-channel MOS transistor $NT_{15}$ constituting the non-inverting amplifier 51 between the high-potential-side power supply voltage $V_{DD}$ and the current source $I_{13}$. Specifically, a drain electrode of the clamp transistor $NT_{17}$ is connected to the node of the high-potential-side power supply voltage $V_{DD}$, and a source electrode is connected to the source electrode of the N-channel MOS transistor $NT_{15}$.

As the clamp transistor $NT_{17}$, an N-channel MOS transistor can be used, for example. A predetermined clamp $V_{clamp}$ is applied to the gate electrode of the clamp transistor $NT_{17}$. Note that the same clamp $V_{clamp}$ is applied to all the pixel columns.

Figure 14:
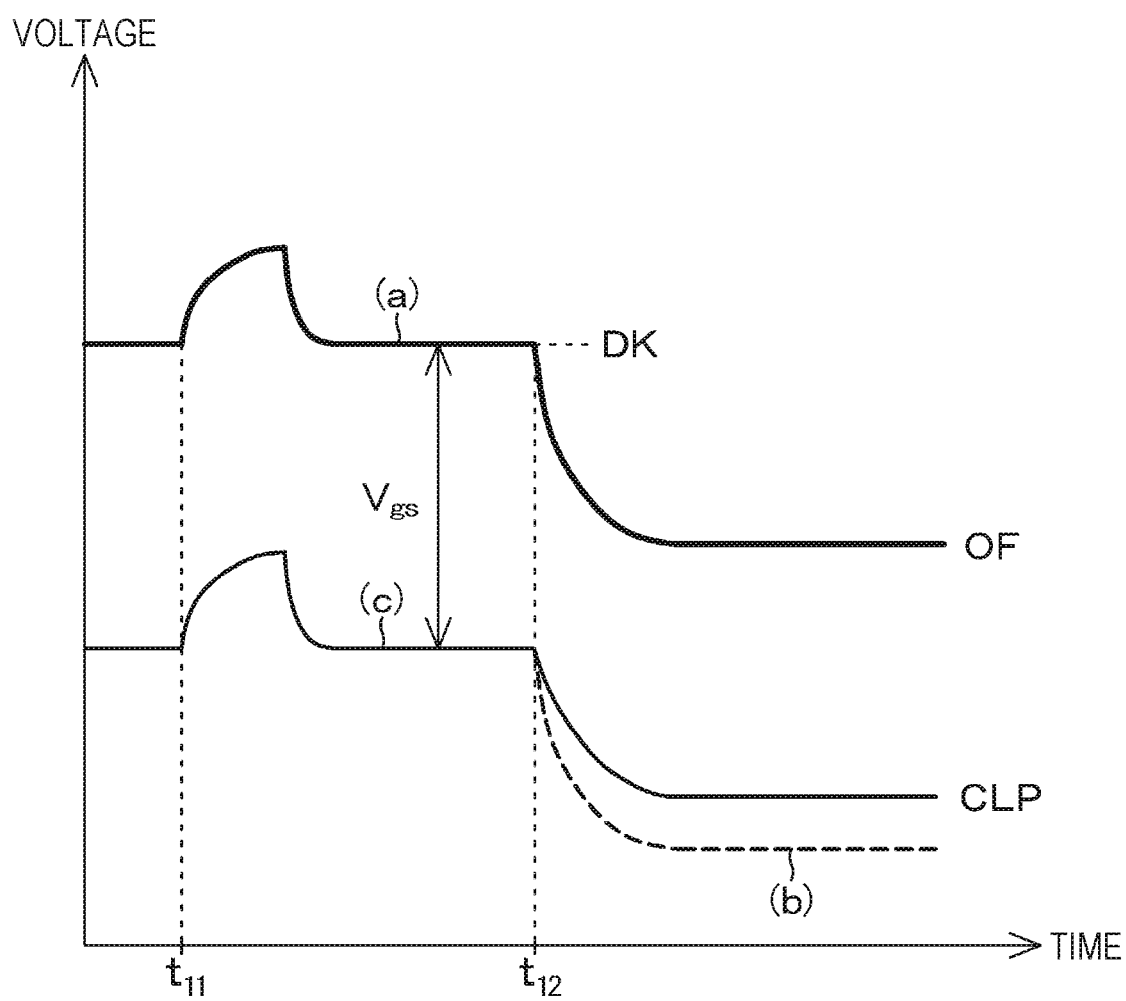
FIG. 14 is a characteristic diagram illustrating an example of voltage variation of a voltage of a signal line and a drain voltage of an N-channel MOS transistor constituting a current source of a negative capacitance circuit for describing an action of a clamp transistor.

The action of the clamp transistor $NT_{17}$ will be described with reference to FIG. 14. Here, it is assumed that the current source $I_{13}$ of the negative capacitance circuit 50 includes, for example, an N-channel MOS transistor $NT_{18}$. FIG. 14 is a characteristic diagram illustrating an example of voltage variation of the voltage of the signal line 32 and the drain voltage $V_d$ of the N-channel MOS transistor $NT_{18}$ constituting the current source $I_{13}$. In FIG. 14, the vertical axis represents the voltage of the signal line 32 or the drain voltage $V_d$ of the N-channel MOS transistor $NT_{18}$, and the horizontal axis represents time.

In FIG. 14, a thick solid line (a) indicates variation of the voltage of the signal line 32, and a broken line (b) indicates variation of the drain voltage $V_d$ of the N-channel MOS transistor $NT_{18}$ in the configuration of the comparator 131 according to Example 2 without having the clamp transistor $NT_{17}$. In addition, a thin solid line (c) indicates variation of the drain voltage $V_d$ of the N-channel MOS transistor $NT_{17}$ in the comparator 131 according to Example 6 provided with the clamp transistor $NT_{18}$.

In the pixel circuit illustrated in FIG. 2, when the transfer signal TRG is activated at time $t_{11}$ and the charge photoelectrically converted by the photodiode 21 is transferred to the floating diffusion FD, the voltage of the signal line 32 decreases from a voltage DK to a voltage OF after time $t_{12}$. The voltage DK is a voltage corresponding to a dark current, and the voltage OF is a voltage corresponding to an amount of light incident on the photodiode 21.

When the amount of incident light is very large, an amount of decrease from the voltage DK to the voltage OF increases. Even in this case, the input-side load current source $I_{11}$ is designed to operate in the saturation region. On the other hand, the drain voltage $V_d$ of the N-channel MOS transistor $NT_{18}$ constituting the current source $I_{13}$ of the negative capacitance circuit 50 is lower than the voltage of the signal line 32 by the gate-source voltage $V_{gs}$. Therefore, in the comparator 131 according to Example 2 without having the clamp transistor $NT_{17}$, there is a possibility that the current source $I_{13}$ operates in the linear region instead of the saturation region due to the decrease in the drain voltage Va. Then, when the current source $I_{13}$ operates in the linear region, a current $I_2$ of the current source $I_{13}$ decreases. Due to the variation in the current $I_2$, the total ground current of a current $I_1$ of the input-side load current source $I_{11}$ and the current $I_2$ of the current source $I_{13}$ varies, resulting in that the streaking characteristic deteriorates.

In view of this, the negative capacitance circuit 50 of the comparator 131 according to Example 6 includes the clamp transistor $NT_{17}$ provided in parallel with the N-channel MOS transistor $NT_{15}$ constituting the non-inverting amplifier 51. According to the negative capacitance circuit 50 having the configuration described above, when the voltage of the signal line 32 is lower than the drain voltage $V_d$ of the N-channel MOS transistor $NT_{18}$ constituting the current source $I_{13}$, the current flowing through the clamp transistor $NT_{17}$ becomes dominant in the current $I_2$ of the current source $I_{13}$. As the voltage of the signal line 32 decreases, the proportion of the current flowing through the clamp transistor $NT_{17}$ increases, and the drain voltage $V_d$ of the N-channel MOS transistor $NT_{18}$ is fixed (clamped) to a constant voltage CLP according to the clamp voltage $V_{clamp}$ applied to the gate electrode.

<Modification>

While the technology according to the present disclosure has been described above on the basis of the preferred embodiment, the technology according to the present disclosure is not limited to the embodiment. The configuration and structure of the imaging device described in the above embodiment are merely illustrative, and can be changed as appropriate. For example, regarding the circuit configuration of the negative capacitance circuit 50, the circuit configuration illustrated in FIG. 9 is an example. The circuit configuration of the negative capacitance circuit is not limited thereto, and various modifications are conceivable. For example, as the capacitive element $C_{13}$ of the negative capacitance circuit 50, a circuit configuration that shares the capacitive element used in the analog-digital converter 130, a circuit configuration that shares the capacitive element used in a sample and hold circuit included in the imaging device, and the like are conceivable.

<Applications>

Figure 15:
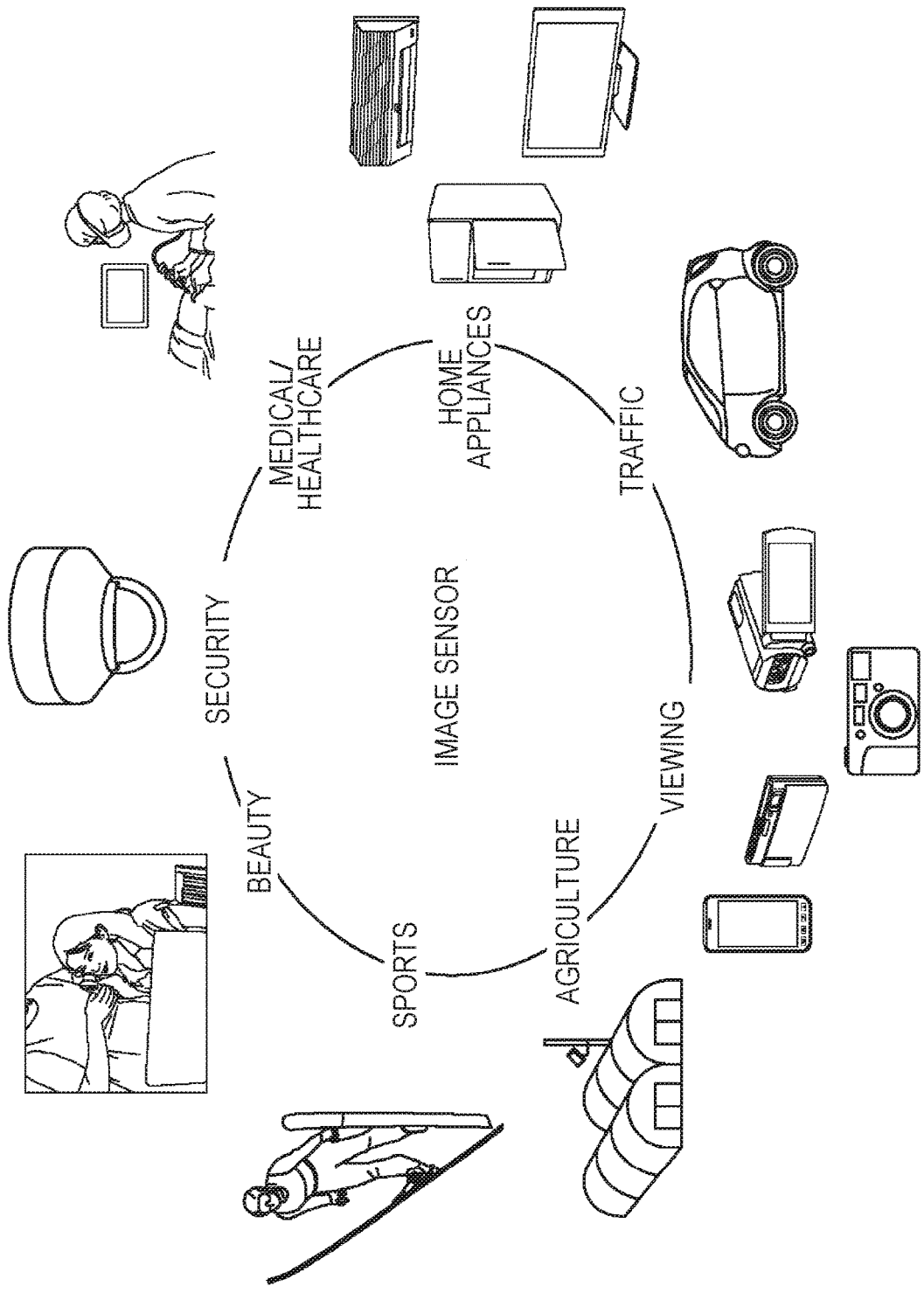
FIG. 15 is a diagram illustrating an application example of the technology according to the present disclosure.

As illustrated in FIG. 15, for example, the imaging device according to the present embodiment described above can be used for various devices that sense light such as visible light, infrared light, ultraviolet light, and X-ray. Specific examples of various devices are listed below.

Devices that capture images used for viewing, such as digital cameras and mobile devices with camera functions.

Devices used for traffic for safe driving such as automatic stop, recognition of the condition of driver, etc., such as: in-vehicle sensors that capture an image of an environment in front of, at the rear of, and around automobile, the interior of the automobile, etc.; surveillance cameras that monitor traveling vehicles or road; or distance measurement sensors that measure the distance between vehicles, etc.

Devices used in home appliances such as TVs, refrigerators, and air conditioners to capture an image of user's gesture and perform operations according to the gesture Devices used for medical and healthcare, such as endoscopes and devices that perform angiography by receiving infrared light Devices used for security, such as surveillance cameras for crime prevention and cameras for personal authentication Devices used for beauty, such as skin measuring devices that capture an image of the skin and microscopes that capture the image of the scalp.

Devices used for sports such as action cameras and wearable cameras for sporting use, etc.

Devices used for agriculture, such as cameras for monitoring the condition of fields and crops Examples of Application of Technology According to Present Disclosure The technology according to the present disclosure can be applied to various products. More specific examples of application will be described below.

[Electronic Apparatus According to Present Disclosure]

Here, a case where the present technology is applied to an electronic apparatus including: an imaging system such as a digital still camera or a video camera; a mobile terminal device having an imaging function such as a mobile phone; a copier using an imaging device in an image reading unit; etc. will be described.

(Example of Imaging System)

Figure 16:
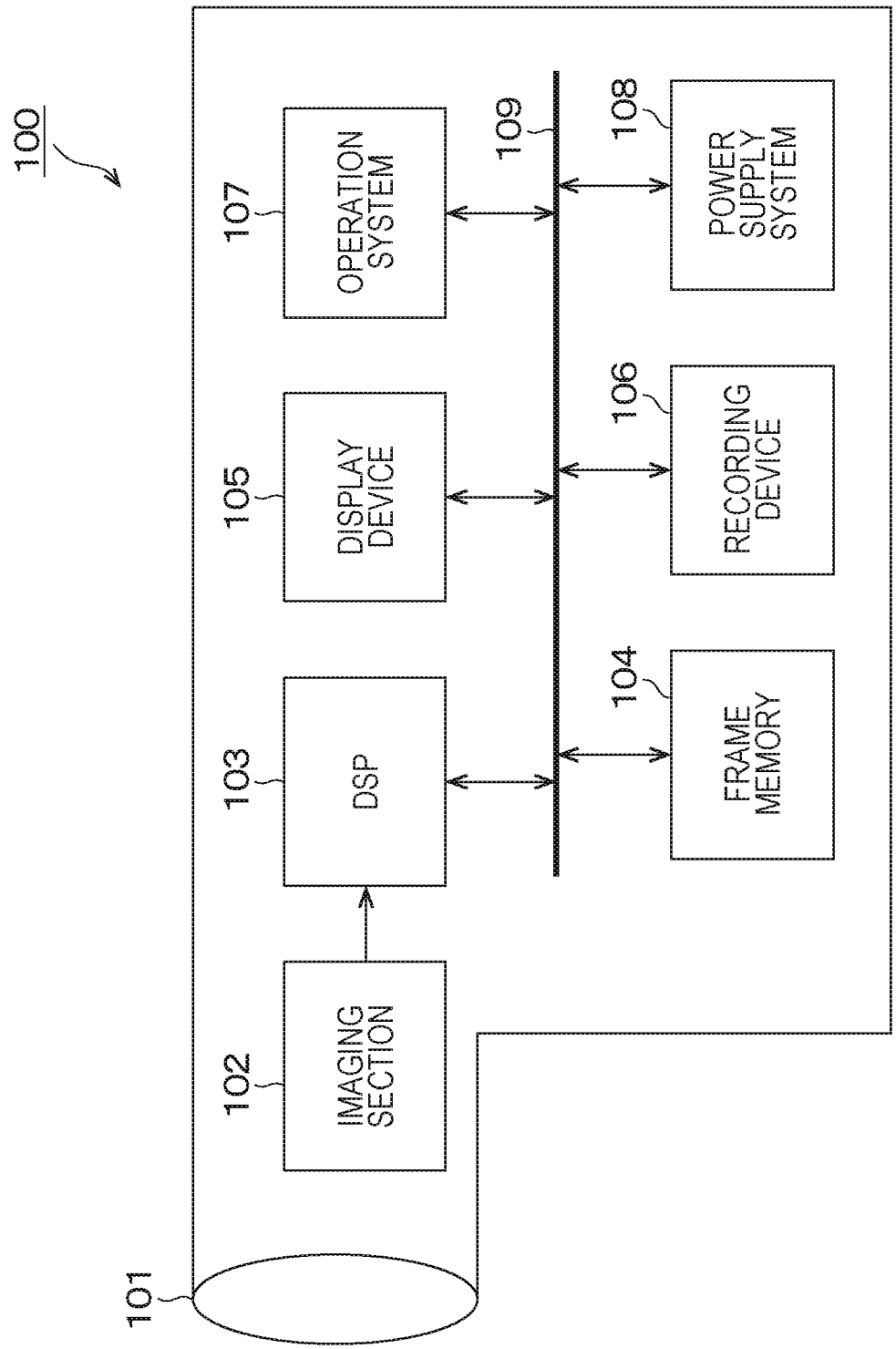
FIG. 16 is a block diagram schematically illustrating a configuration example of an imaging system that is an example of an electronic apparatus according to the present disclosure.

FIG. 16 is a block diagram illustrating a configuration example of an imaging system that is an example of an electronic apparatus according to the present disclosure.

As illustrated in FIG. 16, an imaging system 100 according to the present example includes an imaging optical system 101 including a lens group, etc., an imaging section 102, a digital signal processor (DSP) circuit 103, a frame memory 104, a display device 105, a recording device 106, an operation system 107, a power supply system 108, etc. Then, in this configuration, the DSP circuit 103, the frame memory 104, the display device 105, the recording device 106, the operation system 107, and the power supply system 108 are interconnected via a bus line 109.

The imaging optical system 101 captures incident light (image light) from a subject and forms an image on an imaging surface of the imaging section 102. The imaging section 102 converts the amount of incident light formed into an image on the imaging surface by the optical system 101 into an electric signal on a pixel-by-pixel basis and outputs the electric signal as a pixel signal. The DSP circuit 103 performs general camera signal processing, for example, white balance processing, demosaic processing, gamma correction processing, and the like.

The frame memory 104 is appropriately used for storing data during signal processing in the DSP circuit 103. The display device 105 includes a panel-type display device such as a liquid crystal display device or an organic electro luminescence (EL) display device, and displays a moving image or a still image captured by the imaging section 102. The recording device 106 records the moving image or still image captured by the imaging section 102 on a recording medium such as a portable semiconductor memory, an optical disk, or a hard disk drive (HDD).

The operation system 107 issues operation commands for various functions of the imaging device 100 according to an operation performed by a user. The power supply system 108 appropriately supplies various power supplies, which are operation power supplies for the DSP circuit 103, the frame memory 104, the display device 105, the recording device 106, and the operation system 107, to these power supply targets.

In the imaging system 100 having the above configuration, the imaging device according to the abovementioned embodiment can be used as the imaging section 102. According to the imaging device, the power consumption of the analog-digital converter can be reduced, whereby the power consumption of the imaging device can be reduced. In addition, due to a decrease in the wiring capacitance of the signal line of the imaging device, the settling speed of the pixel signal transmitted by the signal line can be increased, and thus, the frame rate can be improved.

[Application to Mobile Object]

The technology according to the present disclosure (present technology) can be applied to various products. For example, the technology according to the present disclosure may be implemented as an imaging device to be mounted on any type of mobile objects such as vehicles, electric vehicles, hybrid electric vehicles, motorcycles, bicycles, personal mobilities, airplanes, drones, ships, robots, construction machines, and agricultural machines (tractors).

Figure 17:
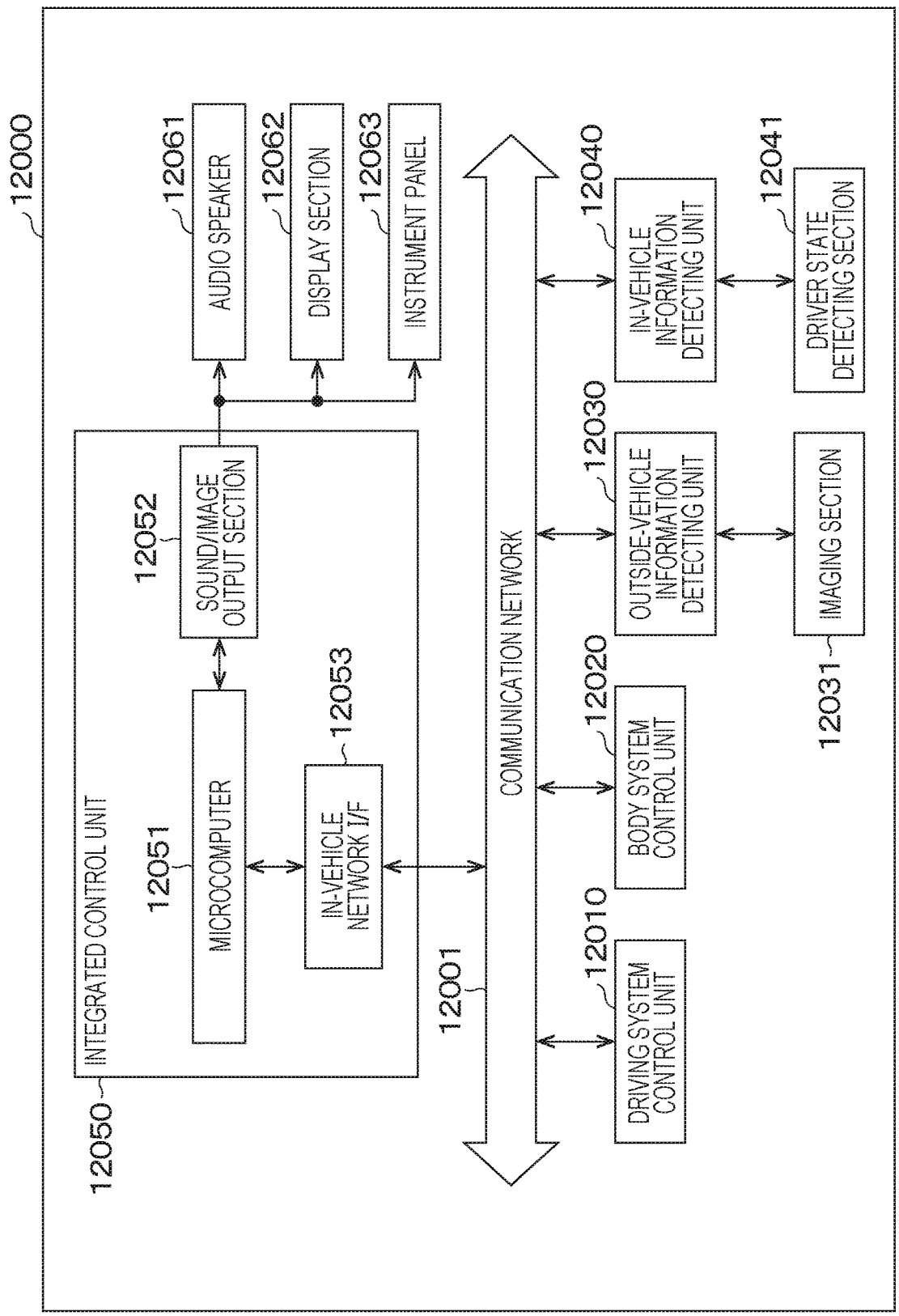
FIG. 17 is a block diagram illustrating a schematic configuration example of a vehicle control system which is an example of a mobile object control system to which the technology according to the present disclosure can be applied.

FIG. 17 is a block diagram depicting an example of schematic configuration of a vehicle control system as an example of a mobile body control system to which the technology according to the present disclosure can be applied.

A vehicle control system 12000 includes a plurality of electronic control units connected to each other via a communication network 12001. In the example depicted in FIG. 17, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 capture an image of the outside of the vehicle, and receives the captured image. The outside-vehicle information detecting unit 12030 may perform, on the basis of the received image, a process of detecting an object such as a person, a vehicle, an obstacle, a road sign, or a character on a road surface, or a process of detecting the distance thereto.

The imaging section 12031 is an optical sensor that receives light and outputs an electric signal corresponding to the amount of received light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041 may include, for example, a camera that captures an image of the driver. On the basis of detection information input from the driver state detecting section 12041, the in-vehicle information detecting unit 12040 may calculate a degree of fatigue of the driver or a degree of concentration of the driver, or may determine whether or not the driver is dozing.

The microcomputer 12051 can calculate a control target value for the driving force generating device, the steering mechanism, or the braking device on the basis of the information about the inside or outside of the vehicle obtained by the outside-vehicle information detecting unit 12030 or the in-vehicle information detecting unit 12040, and output a control command to the driving system control unit 12010. For example, the microcomputer 12051 may perform cooperative control intended to implement functions of an advanced driver assistance system (ADAS) which include collision avoidance or shock mitigation for the vehicle, following driving based on distance between vehicles, vehicle speed maintaining driving, a warning of collision of the vehicle, a warning of lane departure of the vehicle, or the like.

In addition, the microcomputer 12051 may perform cooperative control intended for automated driving, which makes the vehicle travel automatedly without depending on the operation of the driver, or the like, by controlling the driving force generating device, the steering mechanism, the braking device, or the like on the basis of the information about the surroundings of the vehicle obtained by the outside-vehicle information detecting unit 12030 or the in-vehicle information detecting unit 12040.

In addition, the microcomputer 12051 can output a control command to the body system control unit 12020 on the basis of the information about the outside of the vehicle obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound or an image to an output device capable of visually or auditorily giving information to an occupant of the vehicle or the outside of the vehicle. In the example of FIG. 17, an audio speaker 12061, a display section 12062, and an instrument panel 12063 are illustrated as the output device. The display section 12062 may include, for example, at least one of an on-board display or a head-up display.

Figure 18:
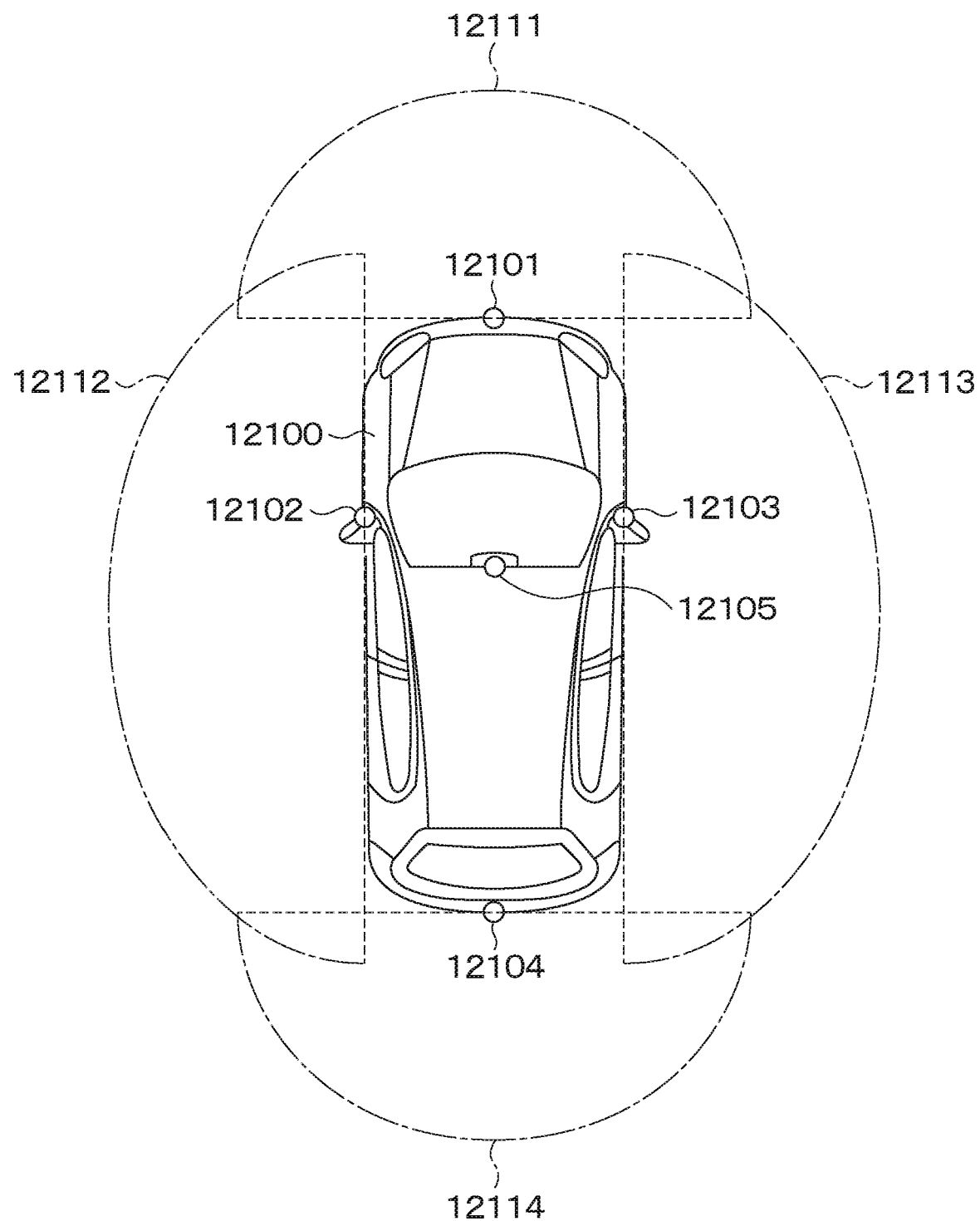
FIG. 18 is a diagram illustrating an example of installation positions of imaging sections in the mobile object control system.

FIG. 18 is a diagram depicting an example of the installation position of the imaging section 12031.

In FIG. 18, a vehicle 12100 includes, as the imaging section 12031, imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of an environment in front of the vehicle 12100. The imaging sections 12102 and 12103 provided on the sideview mirrors acquire mainly an image of an environment on the side of the vehicle 12100. The imaging section 12104 provided on the rear bumper or the back door acquires mainly an image of an environment behind the vehicle 12100. The images of the environment in front of the vehicle obtained by the imaging sections 12101 and 12105 are mainly used for detecting a preceding vehicle, a pedestrian, an obstacle, a traffic light, a traffic sign, a lane, or the like.

Note that FIG. 18 shows examples of imaging ranges of the imaging sections 12101 to 12104. An imaging range 12111 indicates the imaging range of the imaging section 12101 on the front nose, imaging ranges 12112 and 12113 indicate the imaging ranges of the imaging sections 12102 and 12103 on the side-view mirrors, respectively, and an imaging range 12114 indicates the imaging range of the imaging section 12104 on the rear bumper or the back door. A bird's-eye image of the vehicle 12100 as viewed from above can be obtained by superimposing image data captured by the imaging sections 12101 to 12104, for example.

At least one of the imaging sections 12101 to 12104 may have a function of obtaining distance information. For example, at least one of the imaging sections 12101 to 12104 may be a stereo camera including a plurality of imaging elements or an imaging element including pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, the nearest three-dimensional object in particular that is present on a traveling path of the vehicle 12100 and that travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data regarding three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in images captured by the imaging sections 12101 to 12104. Such recognition of a pedestrian is, for example, performed by a procedure of extracting characteristic points in the captured images captured by the imaging sections 12101 to 12104 as infrared cameras and a procedure of determining whether or not an object is a pedestrian by performing pattern matching processing on a series of characteristic points representing the contour of the object. When the microcomputer 12051 determines that there is a pedestrian in the captured images captured by the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure can be applied has been described above. The technology according to the present disclosure can be applied to, for example, the imaging section 12031 and the like in the configuration described above. Then, applying the technology according to the present disclosure to the imaging section 12031 and the like can reduce power consumption of the analog-digital converter, and further, power consumption of the imaging device, and thus, can contribute to reduction in power consumption of the vehicle control system. In addition, due to a decrease in the wiring capacitance of the signal line of the imaging device, the settling speed of the pixel signal transmitted by the signal line can be increased, and thus, the frame rate can be improved.

Possible Configuration of Present Disclosure

It is to be noted that the technology of the present disclosure may have the following configurations.

<<A. Imaging Device>>

[A-01] An imaging device including:

a load current source;

a comparator that is provided between a signal line for transmitting an analog pixel signal read from a pixel and the load current source and compares the analog pixel signal with a predetermined reference signal; and a negative capacitance circuit connected to the signal line;

in which the load current source includes two cascode-connected transistors, and the negative capacitance circuit applies a voltage of the signal line to a common connection node of the two transistors of the load current source via a capacitive element without logic inversion.

[A-02] The imaging device according to [A-01], in which the load current source includes an input-side load current source and an output-side load current source, and the comparator includes:

an input transistor connected between the signal line and the input-side load current source and having a predetermined reference signal as a gate input; and an output transistor connected between the signal line and the output-side load current source and having an output of the input transistor as a gate input.

[A-03] The imaging device according to [A-02], in which the negative capacitance circuit applies the voltage of the signal line to a common connection node of two cascode-connected transistors of the input-side load current source via the capacitive element without logic inversion.

[A-04] The imaging device according to [A-02], in which the negative capacitance circuit applies the voltage of the signal line to a common connection node of two cascode-connected transistors of the output-side load current source via the capacitive element without logic inversion.

[A-05] The imaging device according to [A-02], in which the negative capacitance circuit applies the voltage of the signal line to a common connection node of two cascode-connected transistors of the input-side load current source and a common connection node of two cascode-connected transistors of the output-side load current source via the capacitive element without logic inversion.

[A-06] The imaging device according to [A-02], in which a load current source for signal line having two cascode-connected transistors is connected to the signal line, and the negative capacitance circuit applies the voltage of the signal line to a common connection node of the two cascode-connected transistors of the load current source for signal line via the capacitive element without logic inversion.

[A-07] The imaging device according to [A-06], further including:

a first adjustment unit that adjusts bias voltages of the two cascode-connected transistors of the input-side load current source and bias voltages of the two cascode-connected transistors of the output-side load current source; and a second adjustment unit that adjusts bias voltages of the two cascode-connected transistors of the load current source for signal line.

[A-08] The imaging device according to any one of [A-01] to
[A-07], in which
the negative capacitance circuit includes a non-inverting amplifier having an input end connected to the signal line, and
another end of the non-inverting amplifier is connected to another end of the capacitive element that has one end connected to the common connection node of the two cascode-connected transistors of the load current source.

[A-09] The imaging device according to [A-08], in which
the non-inverting amplifier includes: a transistor that is connected between a high-potential-side power supply and the other end of the capacitive element and that has a gate electrode connected to the signal line; and a current source connected between the other end of the capacitive element and a low-potential-side power supply.

[A-10] The imaging device according to [A-09], in which
the negative capacitance circuit includes a clamp transistor connected in parallel to the transistor constituting the non-inverting amplifier.

<<B. Electronic Apparatus>>

[B-01] An electronic apparatus including an imaging device, the imaging device including:
a load current source;
a comparator that is provided between a signal line for transmitting an analog pixel signal read from a pixel and the load current source and compares the analog pixel signal with a predetermined reference signal; and
a negative capacitance circuit connected to the signal line;
in which
the load current source includes two cascode-connected transistors, and
the negative capacitance circuit applies a voltage of the signal line to a common connection node of the two transistors of the load current source via a capacitive element without logic inversion.

[B-02] The electronic apparatus according to [B-01], in which
the load current source includes an input-side load current source and an output-side load current source, and
the comparator includes:
an input transistor connected between the signal line and the input-side load current source and having a predetermined reference signal as a gate input; and
an output transistor connected between the signal line and the output-side load current source and having an output of the input transistor as a gate input.

[B-03] The electronic apparatus according to [B-02], in which
the negative capacitance circuit applies the voltage of the signal line to a common connection node of two cascode-connected transistors of the input-side load current source via the capacitive element without logic inversion.

[B-04] The electronic apparatus according to [B-02], in which
the negative capacitance circuit applies the voltage of the signal line to a common connection node of two cascode-connected transistors of the output-side load current source via the capacitive element without logic inversion.

[B-05] The electronic apparatus according to [B-02], in which the negative capacitance circuit applies the voltage of the signal line to a common connection node of two cascode-connected transistors of the input-side load current source and a common connection node of two cascode-connected transistors of the output-side load current source via the capacitive element without logic inversion.

[B-06] The electronic apparatus according to [B-02], in which
a load current source for signal line having two cascode-connected transistors is connected to the signal line, and
the negative capacitance circuit applies the voltage of the signal line to a common connection node of the two cascode-connected transistors of the load current source for signal line via the capacitive element without logic inversion.

[B-07] The electronic apparatus according to [B-06], further including:
a first adjustment unit that adjusts bias voltages of the two cascode-connected transistors of the input-side load current source and bias voltages of the two cascode-connected transistors of the output-side load current source; and
a second adjustment unit that adjusts bias voltages of the two cascode-connected transistors of the load current source for signal line.

[B-08] The electronic apparatus according to any one of [B-01] to [B-07], in which
the negative capacitance circuit includes a non-inverting amplifier having an input end connected to the signal line, and
another end of the non-inverting amplifier is connected to another end of the capacitive element that has one end connected to the common connection node of the two cascode-connected transistors of the load current source.

[B-09] The electronic apparatus according to [B-08], in which
the non-inverting amplifier includes: a transistor that is connected between a high-potential-side power supply and the other end of the capacitive element and that has a gate electrode connected to the signal line; and a current source connected between the other end of the capacitive element and a low-potential-side power supply.

[B-10] The electronic apparatus according to [B-09], in which
the negative capacitance circuit includes a clamp transistor connected in parallel to the transistor constituting the non-inverting amplifier.

REFERENCE SIGNS LIST

1 CMOS image sensor
11 Pixel array section
12 Row selection unit
13 Analog-digital conversion unit
14 Logic circuit unit (signal processor)
15 Timing controller
16 Reference signal generation unit
20 Pixel
21 Photodiode
22 Transfer transistor
23 Reset transistor
24 Amplification transistor
25 Selection transistor
31 ($31_1$ to $31_m$) Pixel control line
32 ($32_1$ to $32_n$) Signal line
50 Negative capacitance circuit 51 Non-inverting amplifier
52 First adjustment unit
53 Second adjustment unit
130 Analog-digital converter
131 Comparator
132 Counter
$C_{11}$, $C_{12}$, $C_{13}$ Capacitive element
$I_{11}$ Input-side load current source
$I_{12}$ Output-side load current source
$PT_{11}$ Input transistor
$PT_{12}$ Output transistor

The invention claimed is:

1. An imaging device comprising:
a load current source;
a comparator that is provided between a signal line for transmitting an analog pixel signal read from a pixel and the load current source and compares the analog pixel signal with a predetermined reference signal; and
a negative capacitance circuit connected to the signal line, wherein
the load current source includes two cascode-connected transistors, and
the negative capacitance circuit applies a voltage of the signal line to a common connection node of the two transistors of the load current source via a capacitive element without logic inversion.

2. The imaging device according to claim 1, wherein
the load current source includes an input-side load current source and an output-side load current source, and
the comparator includes:
an input transistor connected between the signal line and the input-side load current source and having a predetermined reference signal as a gate input; and
an output transistor connected between the signal line and the output-side load current source and having an output of the input transistor as a gate input.

3. The imaging device according to claim 2, wherein the negative capacitance circuit applies the voltage of the signal line to a common connection node of two cascode-connected transistors of the input-side load current source via the capacitive element without logic inversion.

4. The imaging device according to claim 2, wherein the negative capacitance circuit applies the voltage of the signal line to a common connection node of two cascode-connected transistors of the output-side load current source via the capacitive element without logic inversion.

5. The imaging device according to claim 2, wherein the negative capacitance circuit applies the voltage of the signal line to a common connection node of two cascode-connected transistors of the input-side load current source and a common connection node of two cascode-connected transistors of the output-side load current source via the capacitive element without logic inversion.

6. The imaging device according to claim 2, wherein
a load current source for signal line having two cascode-connected transistors is connected to the signal line, and
the negative capacitance circuit applies the voltage of the signal line to a common connection node of the two cascode-connected transistors of the load current source for signal line via the capacitive element without logic inversion.

7. The imaging device according to claim 6, further comprising:
a first adjustment unit that adjusts bias voltages of the two cascode-connected transistors of the input-side load current source and bias voltages of the two cascode-connected transistors of the output-side load current source; and
a second adjustment unit that adjusts bias voltages of the two cascode-connected transistors of the load current source for signal line.

8. The imaging device according to claim 1, wherein
the negative capacitance circuit includes a non-inverting amplifier having an input end connected to the signal line, and
another end of the non-inverting amplifier is connected to another end of the capacitive element that has one end connected to the common connection node of the two cascode-connected transistors of the load current source.

9. The imaging device according to claim 8, wherein
the non-inverting amplifier includes: a transistor that is connected between a high-potential-side power supply and the other end of the capacitive element and that has a gate electrode connected to the signal line; and a current source connected between the other end of the capacitive element and a low-potential-side power supply.

10. The imaging device according to claim 9, wherein
the negative capacitance circuit includes a clamp transistor connected in parallel to the transistor constituting the non-inverting amplifier.

11. An electronic apparatus, comprising:
an imaging device that includes:
a load current source;
a comparator that is provided between a signal line for transmitting an analog pixel signal read from a pixel and the load current source and compares the analog pixel signal with a predetermined reference signal; and
a negative capacitance circuit connected to the signal line, wherein
the load current source includes two cascode-connected transistors, and
the negative capacitance circuit applies a voltage of the signal line to a common connection node of the two transistors of the load current source via a capacitive element without logic inversion.

* * * * *